US012660181B2

(12) United States Patent
Lee et al.

(10) Patent No.: US 12,660,181 B2
(45) Date of Patent: Jun. 16, 2026

(54) SEMICONDUCTOR MEMORY DEVICE WITH MESH SUPPORT STRUCTURE

(71) Applicant: SAMSUNG ELECTRONICS CO., LTD., Suwon-si (KR)

(72) Inventors: Jung-Hwan Lee, Seoul (KR); Sun Young Lee, Hwaseong-si (KR); Seok Hwa Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 672 days.

(21) Appl. No.: 18/051,763

(22) Filed: Nov. 1, 2022

(65) Prior Publication Data

US 2023/0217659 A1     Jul. 6, 2023

(30) Foreign Application Priority Data

Dec. 31, 2021     (KR) ........................ 10-2021-0193804

(51) Int. Cl.
H10B 43/27 (2023.01)
H10B 43/40 (2023.01)
(52) U.S. Cl.
CPC ............. H10B 43/27 (2023.02); H10B 43/40 (2023.02)
(58) Field of Classification Search
CPC ........ H10B 53/00; H10B 53/10; H10B 53/20; H10B 53/30; H10B 53/40; H10B 53/50;
(Continued)

(56) References Cited

U.S. PATENT DOCUMENTS

| | | | |
|---|---|---|---|
| 10,651,197 B2 | 5/2020 | Hong et al. | |
| 10,770,477 B2 | 9/2020 | Lee et al. | |

(Continued)

FOREIGN PATENT DOCUMENTS

| | | |
|---|---|---|
| CN | 112272868 | 1/2021 |
| KR | 10-2021-0002398 | 1/2021 |

(Continued)

OTHER PUBLICATIONS

Office Action dated Apr. 21, 2025 issued in corresponding Korean Patent Application No. 10-2021-0193804.

(Continued)

*Primary Examiner* — William B Partridge
*Assistant Examiner* — Gustavo G Ramallo
(74) *Attorney, Agent, or Firm* — MORGAN, LEWIS & BOCKIUS LLP

(57) ABSTRACT

A semiconductor device includes a cell substrate including a cell array region and an extension region surrounding the cell array region, a mold structure including gate electrodes sequentially stacked on the cell substrate, channel structures disposed on the cell array region and intersecting the gate electrodes, a bit-line connected to at least some of the channel structures, a block isolation region cutting the mold structure, a source layer disposed between the cell substrate and the mold structure and connected to a side surface of each of the channel structures, and a support layer disposed between the source layer and the mold structure on upper surfaces of the cell substrate and the source layer. The support layer includes a support structure contacting the upper surface of the cell substrate. The support structure includes a peripheral portion surrounding the cell array region, and a mesh portion disposed on the extension region.

16 Claims, 34 Drawing Sheets

(58) Field of Classification Search
CPC ........ H10B 41/00; H10B 41/10; H10B 41/20;
H10B 41/23; H10B 41/27; H10B 41/30;
H10B 41/35; H10B 41/40–44; H10B
41/46–50; H10B 41/60; H10B 41/70;
H10B 43/00; H10B 43/10; H10B 43/20;
H10B 43/23; H10B 43/27; H10B 43/30;
H10B 43/35; H10B 43/40; H10B 43/50;
H10B 51/00; H10B 51/10; H10B 51/20;
H10B 51/30; H10B 51/40; H10B 51/50
See application file for complete search history.

(56) References Cited

U.S. PATENT DOCUMENTS

| | | | | |
|---|---|---|---|---|
| 11,114,461 | B2 | 9/2021 | Ahn et al. | |
| 2016/0268287 | A1* | 9/2016 | Park | H10B 43/10 |
| 2018/0151590 | A1* | 5/2018 | Lee | H10B 43/35 |
| 2019/0326315 | A1 | 10/2019 | Lee et al. | |
| 2020/0168628 | A1 | 5/2020 | Kim et al. | |
| 2020/0357816 | A1 | 11/2020 | Seo et al. | |
| 2021/0036001 | A1* | 2/2021 | Kim | H10B 41/27 |
| 2021/0257384 | A1 | 8/2021 | Jeong et al. | |
| 2021/0272981 | A1* | 9/2021 | Jeong | H10B 41/40 |
| 2021/0288054 | A1 | 9/2021 | Ryu et al. | |

FOREIGN PATENT DOCUMENTS

| | | | |
|---|---|---|---|
| KR | 10-2021-0015218 | A | 2/2021 |
| KR | 10-2021-0103255 | A | 8/2021 |
| KR | 10-2021-0109703 | A | 9/2021 |
| KR | 102629202 | B1 | 1/2024 |

OTHER PUBLICATIONS

Notice of Allowance dated Dec. 15, 2025 issued in the corresponding Korean Patent Application No. 10-2021-0193804. (Note: KR 10-2021-0109703 A, KR 10-2021-0015218 A, and US 20180151590 A1 already submitted.).

* cited by examiner

SEMICONDUCTOR MEMORY DEVICE WITH MESH SUPPORT STRUCTURE

CROSS-REFERENCE TO RELATED APPLICATION

This application claims priority under 35 U.S.C. § 119 to Korean Patent Application No. 10-2021-0193804, filed on Dec. 31, 2021, in the Korean Intellectual Property Office, the contents of which are herein incorporated by reference in their entirety.

TECHNICAL FIELD

The present disclosure relates to a semiconductor memory device, a manufacturing method thereof, and an electronic system including the same, and more particularly, to a three-dimensional semiconductor memory device having memory cells arranged three-dimensionally, a manufacturing method thereof, and an electronic system including the same.

DISCUSSION OF RELATED ART

Because the integration density of a semiconductor memory device is an important factor in determining a price of an electronic product, increasing integration density of the semiconductor memory devices may be required to meet the rising demand for high performance and low cost electronic products by consumers.

The integration density of a two-dimensional (2D) or planar semiconductor memory device is largely determined by a region occupied by a unit memory cell, and therefore may be greatly affected by a technique of forming fine patterns. However, since ultra-expensive equipment is required to form the fine patterns, to increase the integration density of the 2D semiconductor may be limited. Accordingly, three-dimensional (3D) semiconductor devices including three-dimensionally arranged memory cells have been proposed to overcome the above limitations.

SUMMARY

An embodiment of the present disclosure provides a semiconductor memory device with enhanced yield and quality.

An embodiment of the present disclosure provides a method for manufacturing a semiconductor memory device with enhanced yield and quality.

An embodiment of the present disclosure provides an electronic system including a semiconductor memory device with enhanced yield and quality.

According to an embodiment of the present disclosure, a semiconductor memory device includes a cell substrate including a cell array region and an extension region surrounding the cell array region, a mold structure including a plurality of gate electrodes sequentially stacked on the cell substrate, in which the plurality of gate electrodes are stacked in a stepwise manner on the extension region, a plurality of channel structures disposed on the cell array region and extending in a vertical direction intersecting an upper surface of the cell substrate, in which each of the plurality of channel structures intersects the plurality of gate electrodes, a bit-line extending in a first direction intersecting the vertical direction, in which the bit-line is connected to at least some of the plurality of channel structures, a block isolation region extending in a second direction intersecting the vertical direction and the first direction, in which the block isolation region cuts the mold structure, a source layer disposed between the cell substrate and the mold structure, and connected to a side surface of each of the channel structures, and a support layer disposed between the source layer and the mold structure, in which the support layer extends along and on the upper surface of the cell substrate and an upper surface of the source layer. The support layer may include a support structure in contact with the upper surface of the cell substrate, and the support structure may include a peripheral portion continuously extending so as to surround the cell array region in a plan view of the device, and a mesh portion disposed on the extension region and having a mesh shape in the plan view.

According to an embodiment of the present disclosure, a semiconductor memory device includes a cell substrate including a cell array region and a first region, in which the cell array region and the first region are arranged along a first direction, a mold structure including a plurality of gate electrodes sequentially stacked on the cell substrate, in which the plurality of gate electrodes are stacked in a stepwise manner along the first direction on the first region, a plurality of channel structures disposed on the cell array region and extending in a vertical direction intersecting an upper surface of the cell substrate, in which each of the plurality of channel structures intersects the plurality of gate electrodes, a block isolation region extending in the second direction intersecting the first direction, in which the block isolation cuts the mold structure, a source layer disposed between the cell substrate and the mold structure, and connected to a side surface of each of the channel structures, and a support layer disposed between the source layer and the mold structure, and extending along and on the upper surface of the cell substrate and an upper surface of the source layer. The support layer may include a support structure in contact with the upper surface of the cell substrate, and the support structure may include a plurality of first extensions disposed on the first region, arranged side by side, and extending in the second direction.

According to an embodiment of the present disclosure, an electronic system device includes a main substrate, a semiconductor memory device disposed on the main substrate, and a controller disposed on the main substrate and electrically connected to the semiconductor memory device. The semiconductor memory device may include a cell substrate including a cell array region and an extension region surrounding the cell array region, a mold structure including a plurality of gate electrodes sequentially stacked on the cell substrate, in which the plurality of gate electrodes are stacked in a stepwise manner on the extension region, a plurality of channel structures disposed on the cell array region and extending in a vertical direction intersecting an upper surface of the cell substrate, in which each of the plurality of channel structures intersects the plurality of gate electrodes, a source layer disposed between the cell array region of the cell substrate and the mold structure, and connected to a side surface of each of the channel structures, and a support layer disposed between the source layer and the mold structure, in which the support layer extends along and on the upper surface of the cell substrate and an upper surface of the source layer. The support layer may include a support structure in contact with the upper surface of the cell substrate, at least a portion of the support structure may continuously extend, and surround the cell array region, and the support structure may be formed in a mesh shape on the extension region in a plan view of the device.

BRIEF DESCRIPTION OF THE DRAWINGS

The above and other aspects and features of the present disclosure will become more apparent by describing in detail embodiments thereof with reference to the attached drawings, in which:

FIG. 3 is an exemplary layout diagram for illustrating a semiconductor memory device according to an embodiment of the present disclosure;

FIG. 9 is an exemplary layout diagram for illustrating a semiconductor memory device according to an embodiment of the present disclosure;

FIGS. 17 to 22, 23*a*, 23*b*, and 24 to 32 are diagrams of structures of intermediate steps for illustrating a method of manufacturing a semiconductor memory device according to an embodiment of the present disclosure;

Figure 1:
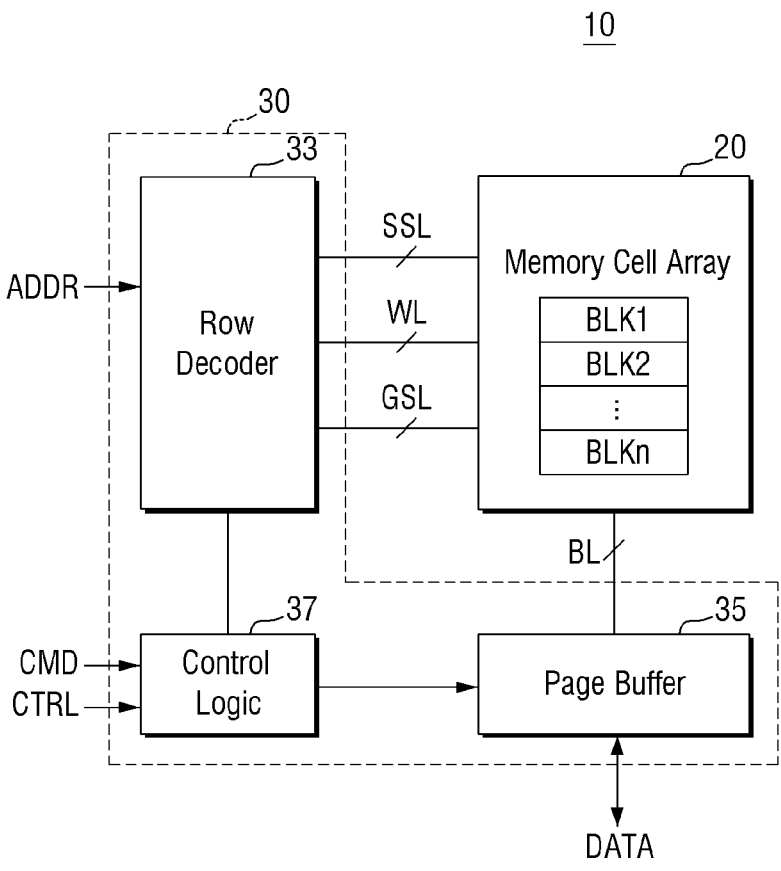
FIG. 1 is an exemplary block diagram for illustrating a semiconductor memory device according to an embodiment of the present disclosure.

Since the drawings in FIGS. 1-35 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, or vice versa, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between and connected to the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between and connected to the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between and connected to the former and the latter. Further, as used herein, when a layer, film, region, plate, or the like may be disposed "below" or "under" another layer, film, region, plate, or the like, the former may directly contact the latter or still another layer, film, region, plate, or the like may be disposed between and connected to the former and the latter. As used herein, when a layer, film, region, plate, or the like is directly disposed "below" or "under" another layer, film, region, plate, or the like, the former directly contacts the latter and still another layer, film, region, plate, or the like is not disposed between and connected to the former and the latter.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may be actually executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is indicated. The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath", "below", "lower", "under", "above", "upper", and the like, may be used herein for ease of explanation for illustrating one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be oriented differently, for example, rotated 90 degrees or at other orientations, and the spatially relative descriptors used herein should then be interpreted accordingly.

Terms as used herein "first direction Y", "second direction X" and "third direction Z" should not be interpreted only to have a geometric relationship in which the first direction, the second direction, and the third direction are perpendicular to each other. The "first direction Y", "second direction X" and "third direction Z" may be interpreted to have a broader direction within a range in which components herein may work functionally.

Hereinafter, embodiments of the present disclosure will be described in detail with reference to the accompanying drawings. The same reference numerals are used for the same components in the drawings, and duplicate descriptions thereof are omitted.

Hereinafter, a semiconductor memory device according to embodiments will be described with reference to FIGS. 1 to 16.

FIG. 1 is an exemplary block diagram for illustrating a semiconductor memory device according to an embodiment of the present disclosure.

Referring to FIG. 1, a semiconductor memory device 10 according to an embodiment of the present disclosure includes a memory cell array 20 and a peripheral circuit 30.

The memory cell array 20 may include a plurality of memory cell blocks (BLK1 to BLKn). Each of the memory cell blocks BLK1 to BLKn may include a plurality of memory cells. The memory cell array 20 may be connected to the peripheral circuit 30 via a bit-line BL, a word-line WL, at least one string select line SSL, and at least one ground select line GSL. For example, the memory cell blocks BLK1 to BLKn may be connected to a row decoder 33 via the word-line WL, the string select line SSL, and the ground select line GSL. Further, the memory cell blocks BLK1 to BLKn may be connected to a page buffer 35 via the bit-line BL.

The peripheral circuit 30 may receive an address ADDR, a command CMD, and a control signal CTRL from an external device to the semiconductor memory device 10, and may transmit and receive data DATA to and from an external device to the semiconductor memory device 10. The peripheral circuit 30 may include a control logic 37, the row decoder 33, and the page buffer 35. The peripheral circuit 30 may further include various sub-circuits such as, for example, an input/output circuit, a voltage generation circuit for generating various voltages required for an operation of the semiconductor memory device 10, and an error correction circuit for correcting an error of the data DATA read from the memory cell array 20.

The control logic 37 may be connected to the row decoder 33, the input/output circuit, and the voltage generation circuit. The control logic 37 may control overall operations of the semiconductor memory device 10. The control logic 37 may generate various internal control signals used in the semiconductor memory device 10 in response to the control signal CTRL. For example, the control logic 37 may adjust a voltage level of a voltage supplied to the word-line WL and the bit-line BL when performing a memory operation such as, for example, a program operation or an erase operation.

The row decoder 33 may select at least one of the plurality of memory cell blocks BLK1 to BLKn in response to the address ADDR, and may select at least one word-line WL, at least one string select line SSL, and at least one ground select line GSL of the selected at least one memory cell block BLK1 to BLKn. Further, the row decoder 33 may transmit a voltage for performing a memory operation to the word-line WL of the selected at least one memory cell block BLK1 to BLKn. The peripheral circuit 30 may not be limited to only include the row decoder 33. For example, in an embodiment of the present disclosure, the peripheral circuit 30 may further include a column decoder. The column decoder may communicate with the plurality of memory cell blocks BLK1 to BLKn through a plurality of bit-lines BL. For example, the control logic 37 may transmit column address signals to the column decoder, and the column decoder may decode the column address signals and transmit decoded column address signals to the plurality of memory cell blocks BLK1 to BLKn through the plurality of bit-lines BL.

The page buffer 35 may be connected to the memory cell array 20 via the bit-line BL. The page buffer 35 may operate as a writer driver or a sense amplifier. For example, when performing a program operation, the page buffer 35 operates as the writer driver to apply a voltage based on the data DATA to be stored in the memory cell array 20 to the bit-line BL. On the other hand, when performing a read operation, the page buffer 35 may operate as the sense amplifier to detect the data DATA stored in the memory cell array 20. For example, output signals of the memory cell array 20 may be transmitted to the sense amplifier, and the amplified output signals may be transmitted to the control logic 37.

Figure 2:
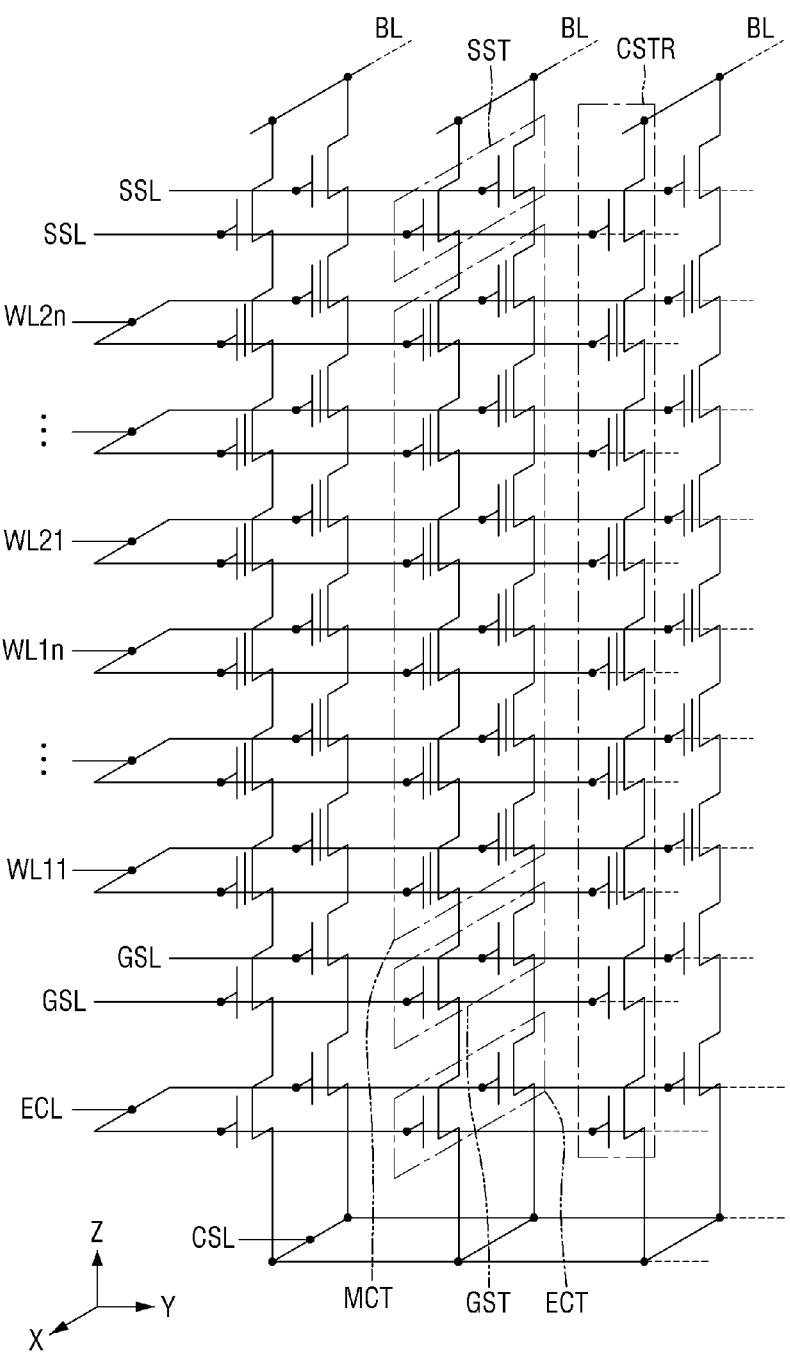
FIG. 2 is an exemplary circuit diagram to illustrate a semiconductor memory device in accordance with an embodiment of the present disclosure.

FIG. 2 is an exemplary circuit diagram to illustrate a semiconductor memory device in accordance with an embodiment of the present disclosure.

Referring to FIG. 2, a memory cell array (e.g., 20 in FIG. 1) of a semiconductor memory device according to an embodiment of the present disclosure includes a common source line CSL, a plurality of bit-lines BL, and a plurality of cell strings CSTR.

The common source line CSL and the plurality of bit-lines BL may intersect each other. For example, the plurality of bit-lines BL may be spaced apart from each other and may extend in the second direction X, while the common source line CSL may extend in the first direction Y intersecting the second direction X. The plurality of cell strings CSTR may be connected in parallel to each of the bit-lines BL. The cell strings CSTR may be commonly connected to the common source line CSL. Thus, the cell strings CSTR may be two-dimensionally arranged on the common source line CSL or a substrate. That is, the plurality of cell strings CSTR may be disposed between the bit-lines BL and the common source line CSL.

In an embodiment of the present disclosure, a plurality of common source lines CSL may be two-dimensionally arranged. For example, the plurality of common source lines CSL may be spaced apart from each other and may extend in the first direction Y. The same voltage may be electrically applied to the common source lines CSL. Alternatively, different voltages may be applied to the common source lines CSL such that the common source lines CSL are separately controlled.

Each cell string CSTR may include a ground select transistor GST connected to the common source line CSL, a string select transistor SST connected to the bit-line BL, and a plurality of memory cell transistors MCT disposed between the ground select transistor GST and the string select transistor SST. Each of the memory cell transistors MCT may include a data storage element. The ground select transistor GST, the string select transistor SST, and the memory cell transistors MCT may be connected in series to each other.

The common source line CSL may be commonly connected to sources of ground select transistors GST. Further, a ground select line GSL, a plurality of word-lines WL11 to WL1n, and WL21 to WL2n and a string select line SSL may be disposed between the common source line CSL and the bit-line BL. The ground select line GSL may act as a gate electrode of the ground select transistor GST, and the word-lines WL11 to WL1n and WL21 to WL2n may act as gate electrodes of the memory cell transistors MCT, and the string select line SSL may act as a gate electrode of the string select transistor SST. Thus, the ground select transistor GST, the memory cell transistors MCT and the string select transistor SST may be connected in series to each other. For example, since one cell string CSTR includes the memory cell transistors MCT respectively located at different levels from the common source line CSL, the word-lines WL11 to WL1n and WL21 to WL2n, which may act as gate electrodes for the memory cell transistors MCT, may respectively located at different levels from each other between the common source line CSL and the bit-lines BL. In an embodiment of the present disclosure, the ground and string select transistors GST and SST and the memory cell transistors MCT may be metal-oxide-semiconductor (MOS) field effect transistors (FETs) using a vertical channel structure as channel regions.

In an embodiment of the present disclosure, an erase control transistor ECT may be disposed between the common source line CSL and the ground select transistor GST. The common source line CSL may be commonly connected to sources of erase control transistors ECT. Further, an erase control line ECL may be disposed between the common source line CSL and the ground select line GSL. The erase control line ECL may act as a gate electrode of the erase control transistor ECT. The erase control transistors ECT may generate gate induced drain leakage (GIDL) to perform an erase operation of the memory cell array. For example, the erase control transistors ECT may be used in an erase operation for erasing data stored in the memory cell transistors MCT through gate induced drain leakage (GIDL) phenomenon.

Figure 3:
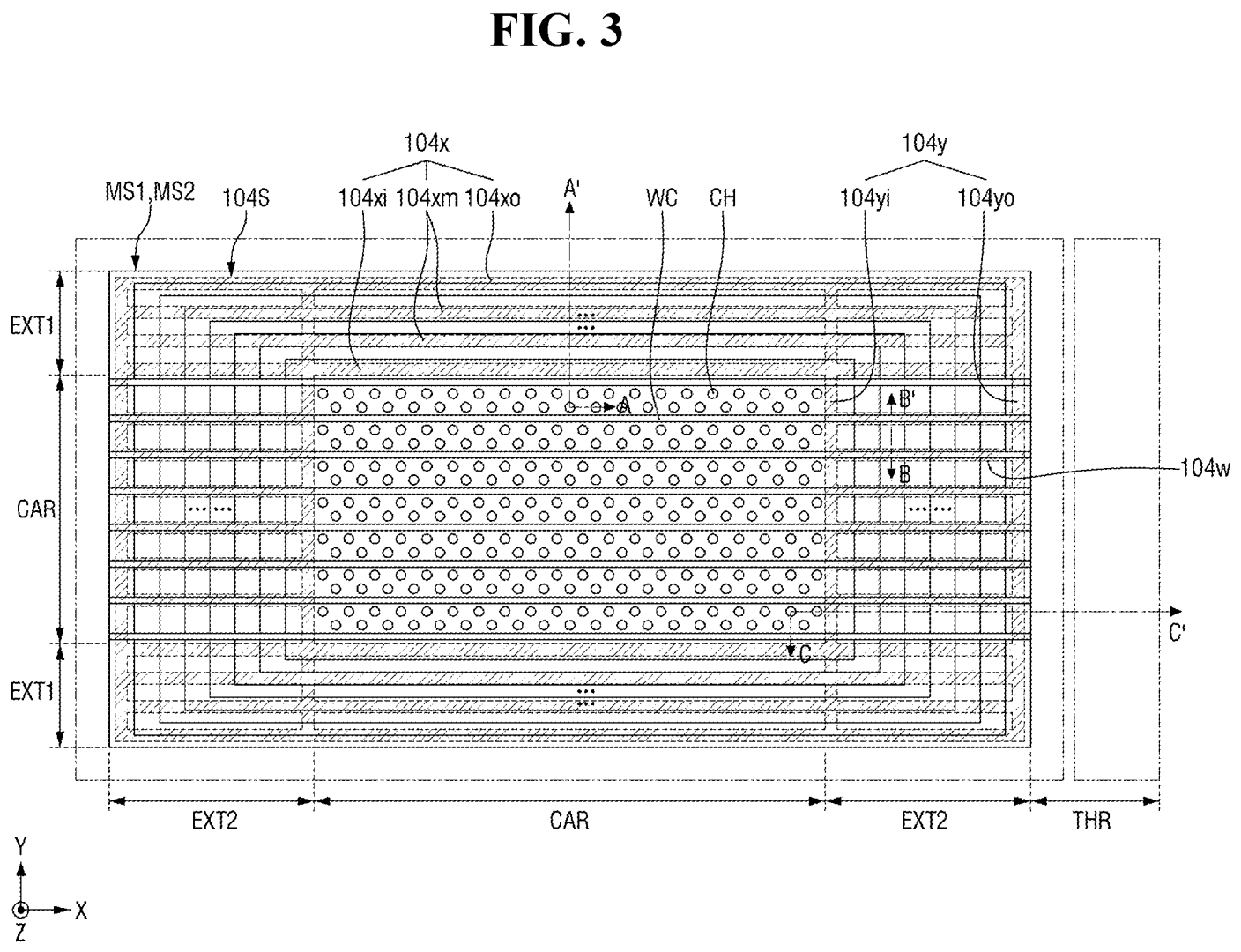
Figure 4:
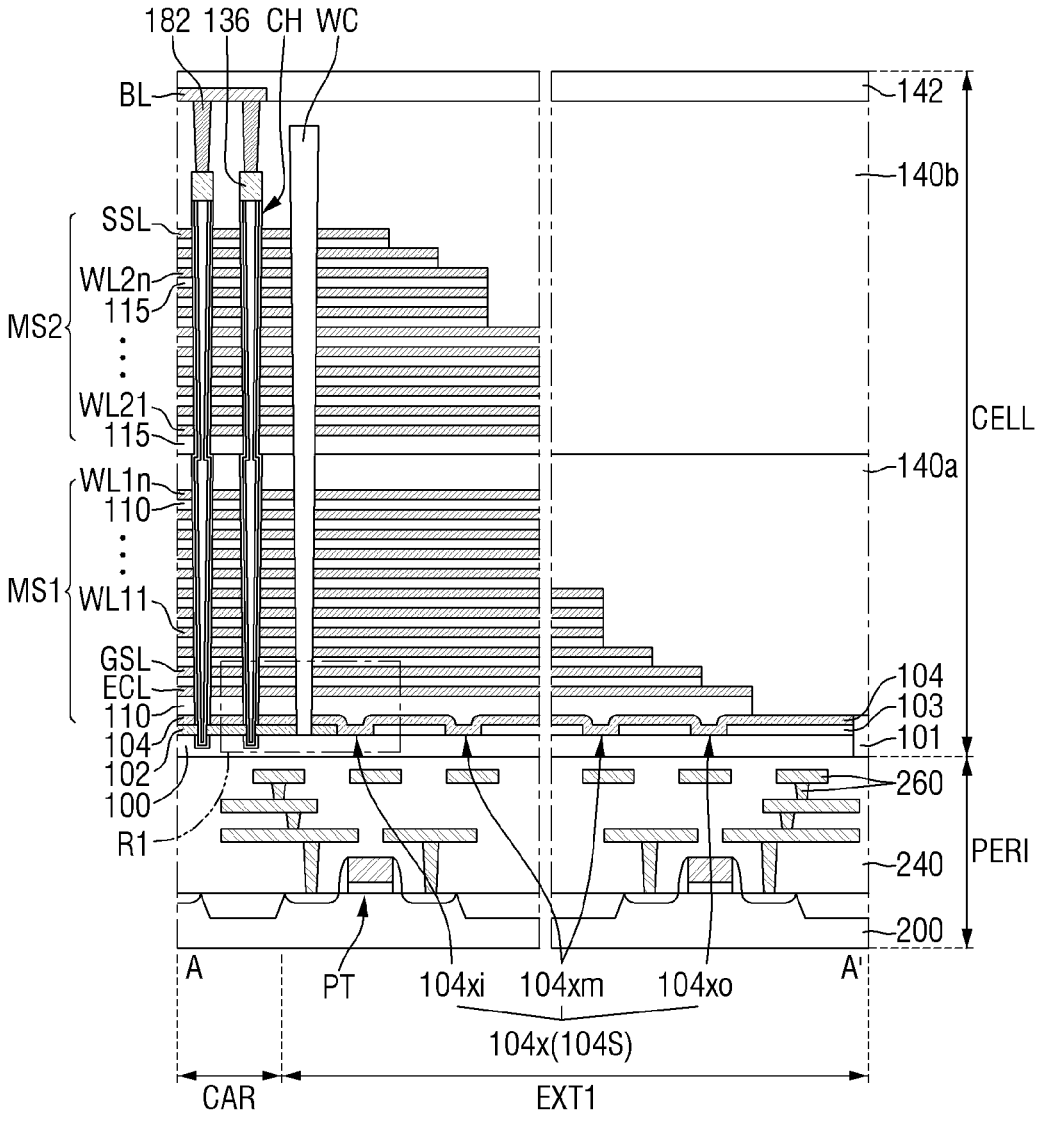
FIG. 4 is a cross-sectional view taken along A-A' in FIG. 3.
Figure 5:
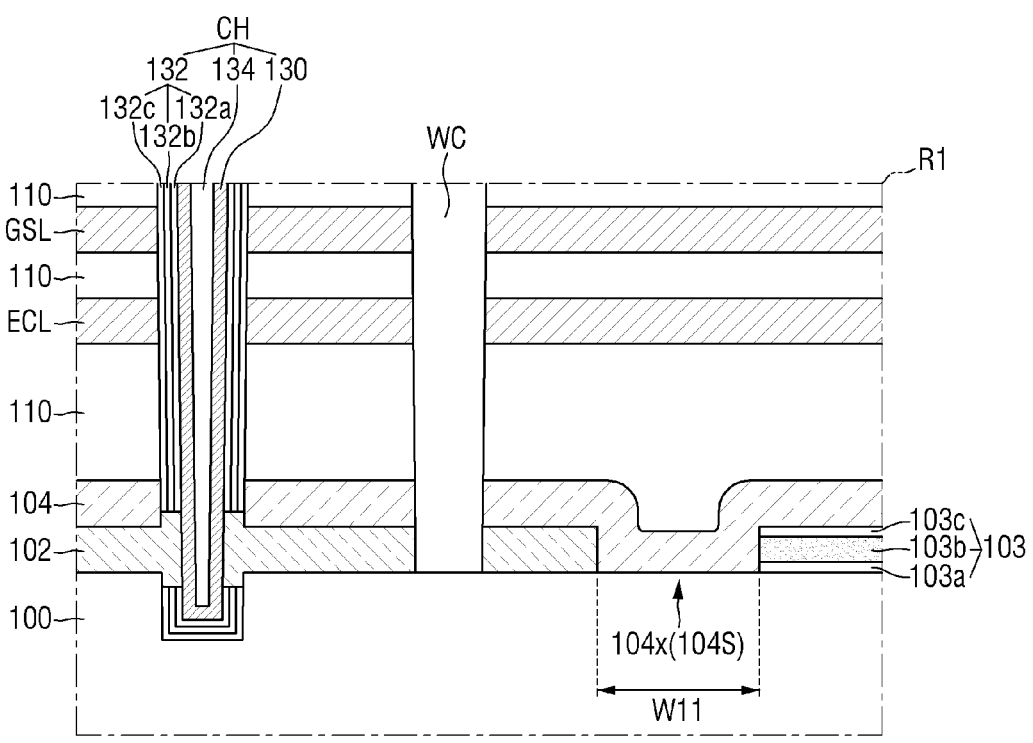
FIG. 5 is an enlarged view to illustrate R1 region of FIG. 4.
Figure 6:
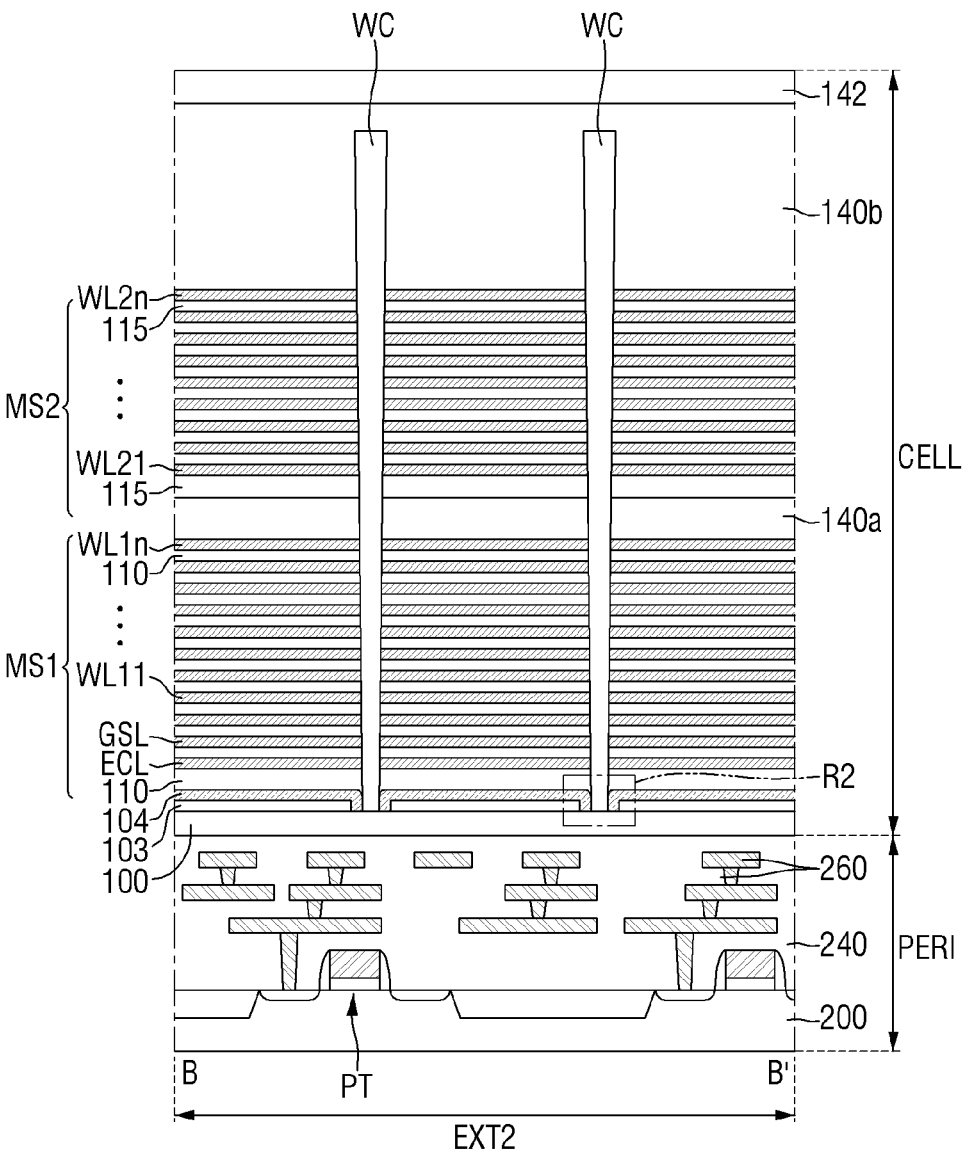
FIG. 6 is a cross-sectional view taken along B-B' in FIG. 3.
Figure 7:
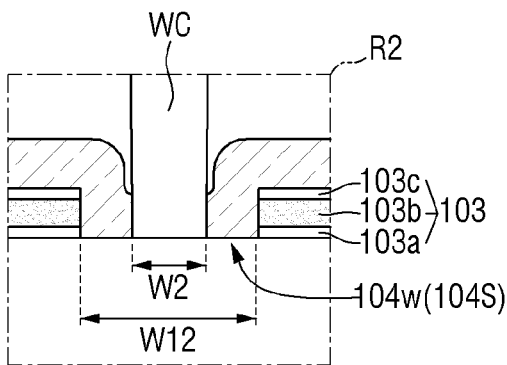
FIG. 7 is an enlarged view to illustrate R2 region of FIG. 6.
Figure 8:
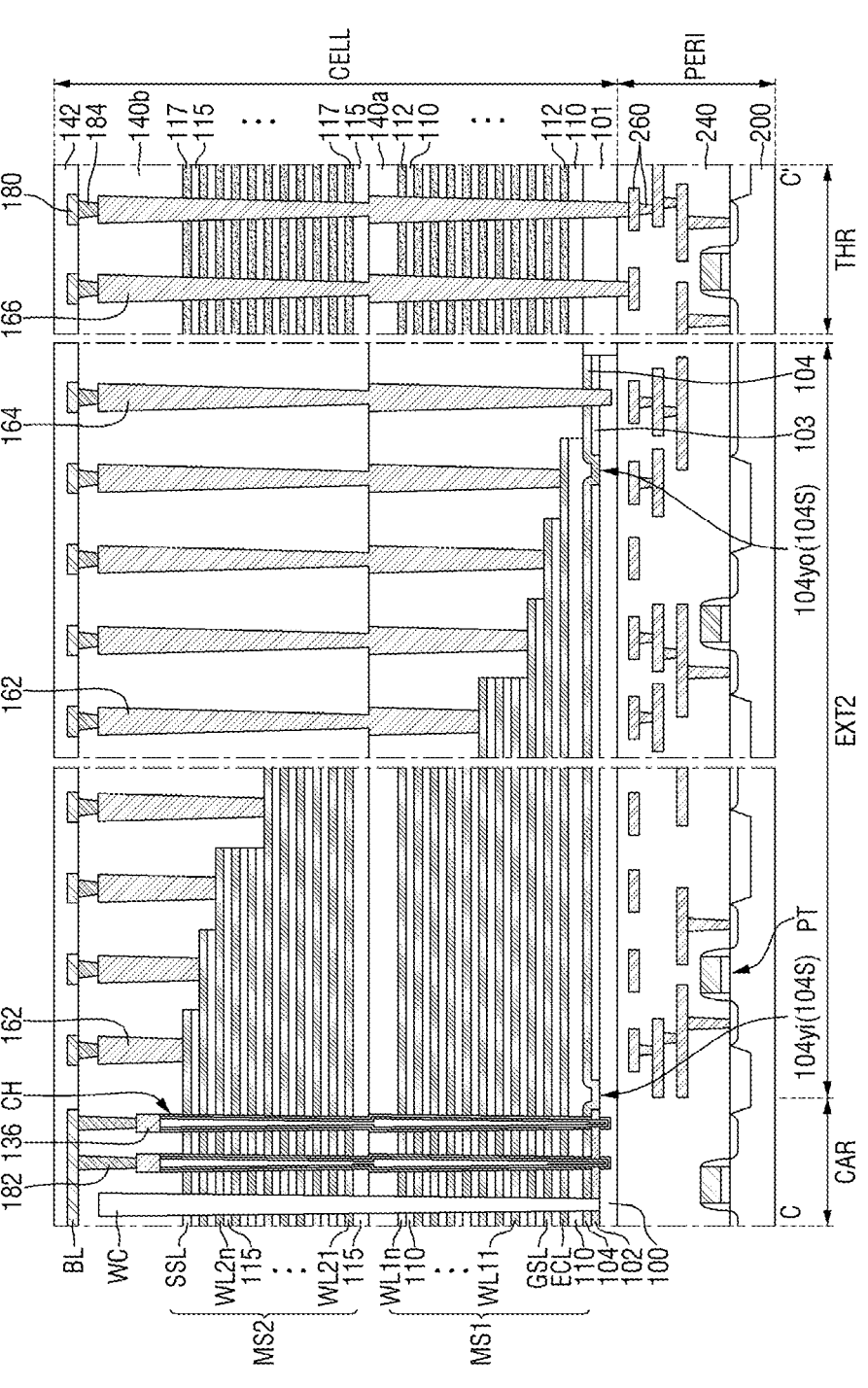
FIG. 8 is a cross-sectional view taken along C-C' in FIG. 3.

FIG. 3 is an exemplary layout diagram for illustrating a semiconductor memory device according to an embodiment of the present disclosure. FIG. 4 is a cross-sectional view taken along A-A' in FIG. 3. FIG. 5 is an enlarged view to illustrate R1 region of FIG. 4. FIG. 6 is a cross-sectional view taken along B-B' in FIG. 3. FIG. 7 is an enlarged view to illustrate R2 region of FIG. 6. FIG. 8 is a cross-sectional view taken along C-C' in FIG. 3.

Referring to FIGS. 3 to 8, a semiconductor memory device according to an embodiment of the present disclosure includes a memory cell region CELL and a peripheral circuit region PERI.

The memory cell region CELL may include a cell substrate 100, an insulating substrate 101, a mold structure MS1 and MS2, an interlayer insulating film 140a and 140b, a plurality of channel structures CH, a source layer 102, a source sacrificial layer 103, a support layer 104, a block isolation region WC, a bit-line BL, a cell contact 162, a substrate contact 164, a through-via 166 and a first line structure 180.

The cell substrate 100 may include, for example, a semiconductor substrate such as, for example, a silicon (Si) substrate, a germanium (Ge) substrate, a silicon-germanium (SiGe) substrate, a III-V compound semiconductor substrate, a single-crystalline epitaxial layer grown on a single-crystalline silicon (Si) substrate, or a combination thereof. Any suitable III-V compound semiconductor may be used for the cell substrate 100 and may include, for example, gallium phosphide (GaP), gallium arsenide (GaAs), gallium antimonide (GaSb), indium arsenide (InAs), indium antimonide (InSb), lead tellurium (PbTe) compounds, indium phosphide (InP), indium gallium arsenide (InGaAs), or a combination thereof. Alternatively, the cell substrate 100 may include a silicon-on-insulator (SOI) substrate or a germanium-on-insulator (GOI) substrate. In an embodiment of the present disclosure, the cell substrate 100 may include impurities. For example, the cell substrate 100 may include n-type impurities (e.g., phosphorus (P), arsenic (As), etc.).

The cell substrate 100 may include a cell array region CAR and an extension region EXT1 and EXT2.

The memory cell array (e.g., 20 in FIG. 1) including the plurality of memory cells may be formed on the cell array region CAR. For example, the channel structure CH, the bit-line BL, and the gate electrodes ECL, GSL, WL11 to WL1$n$, WL21 to WL2$n$, and SSL, etc. to be described later may be disposed on the cell array region CAR. In a following description, a surface of the cell substrate 100 on which the memory cell array is disposed may be referred to as a front surface of the cell substrate 100. A surface of the cell substrate 100 opposite to the front surface of the cell substrate 100 may be referred to as a back surface of the cell substrate 100.

The extension region EXT1 and EXT2 may be disposed around the cell array region CAR. For example, the extension region EXT1 and EXT2 may include the first region EXT1 and the second region EXT2. The first region EXT1 of the extension region EXT1 and EXT2, and the cell array region CAR may be arranged in the first direction Y, while the second region EXT2 of the extension region EXT1 and EXT2 and the cell array region CAR may be arranged in the second direction X. The first region EXT1 and the second region EXT2 may be respectively disposed on both sides of the cell array region CAR to surround the cell array region CAR.

The gate electrodes ECL, GSL, WL11 to WL1$n$, WL21 to WL2$n$, and SSL to be described later may be disposed in the extension region EXT1 and EXT2 and may be stacked in a step manner. For example, the gate electrodes ECL, GSL, WL11 to WL1$n$, WL21 to WL2$n$, and SSL on the first region EXT1 may be stacked in a step manner along the first direction Y. The gate electrodes ECL, GSL, WL11 to WL1$n$, WL21 to WL2$n$, and SSL on the second region EXT2 may be stacked in a step manner along the second direction X. For example, the gate electrode ECL, GSL, WL11 to WL1$n$, WL21 to WL2$n$, and SSL may extend in the first direction Y, and the gate electrodes ECL, GSL, WL11 to WL1$n$, WL21 to WL2$n$, and SSL may be staked in a staircase shape in which extension lengths in the first direction Y may gradually decrease in a stepwise manner from a lowermost level toward an uppermost level on the first region EX1. Similarly, the gate electrodes ECL, GSL, WL11 to WL1$n$, WL21 to WL2$n$, and SSL may be staked in a staircase shape in which extension lengths in the second direction X may gradually decrease in a stepwise manner from a lowermost level toward an uppermost level on the second region EX2.

In an embodiment of the present disclosure, the cell substrate 100 may further include a through region THR. The through region THR may be disposed in the cell array region CAR and the extension region EXT1 and EXT2, or may be disposed outside the cell array region CAR and the extension region EXT1 and EXT2. A through-via 166 to be described later may be disposed in the through region THR.

The insulating substrate 101 may be formed in at least a portion of the cell substrate 100 and in the extension region EXT1 and EXT2. The insulating substrate 101 may constitute an insulating region in the cell substrate 100 and in the extension region EXT1 and EXT2. The insulating substrate 101 may include at least one of, for example, silicon oxide (SiO$_2$), silicon nitride (Si$_3$N$_4$), silicon oxynitride (SiON), or silicon carbide (SiC). However, the present disclosure is not limited thereto. In an embodiment of the present disclosure, the insulating substrate 101 may be formed in at least a portion of the cell substrate 100 and in the through region THR.

A bottom surface of the insulating substrate 101 is only shown to be coplanar with a bottom surface of the cell substrate 100. However, this is only an example. In another example, a vertical level of the bottom surface of the insulating substrate 101 may be lower than that of the bottom surface of the cell substrate 100.

The mold structure MS1 and MS2 may be formed on the front surface of the cell substrate 100. The mold structure MS1 and MS2 may include the plurality of gate electrodes ECL, GSL, WL11 to WL1$n$, WL21 to WL2$n$, and SSL and a plurality of mold insulating films 110 and 115 stacked on the cell substrate 100. Each of the gate electrodes ECL, GSL, WL11 to WL1$n$, WL21 to WL2$n$, and SSL and each of the mold insulating films 110 and 115 may have a layered structure extending in a parallel manner to the front surface of the cell substrate 100. The gate electrodes ECL, GSL, WL11 to WL1$n$, WL21 to WL2$n$, and SSL may be sequentially stacked on the cell substrate 100 while being spaced apart from each other via each of the mold insulating films 110 and 115.

In an embodiment of the present disclosure, the mold structure MS1 and MS2 may include the first mold structure MS1 and the second mold structure MS2 that are sequentially stacked on the cell substrate 100.

The first mold structure MS1 may include the first gate electrodes ECL, GSL1, GSL2, and WL11 to WL1$n$ and the first mold insulating films 110 alternately stacked on the cell substrate 100. In an embodiment of the present disclosure, the first gate electrodes ECL, GSL1, GSL2, and WL11 to WL1$n$ may include the erase control line ECL, the ground select line GSL, and a plurality of first word-lines WL11 to WL1$n$ sequentially stacked on the cell substrate 100. The number and arrangement of the erase control line ECL, the ground select line GSL, and the first word-lines WL11 to WL1$n$ are merely examples. The present disclosure is not limited thereto. For example, in an embodiment of the present disclosure, the erase control line ECL may be omitted.

The second mold structure MS2 may include the second gate electrodes WL21 to WL2$n$, SSL1 and SSL2 and the second mold insulating films 115 that are alternately stacked on the first mold structure MS1. In an embodiment of the present disclosure, the second gate electrodes WL21 to WL2$n$, SSL1, and SSL2 may include a plurality of second word-lines WL21 to WL2$n$ and the string select line SSL sequentially stacked on the first mold structure MS1. The number and arrangement of the second word-lines WL21 to WL2$n$ and the string select line SSL are merely examples. The present disclosure is not limited thereto.

Each of the gate electrodes ECL, GSL, WL11 to WL1$n$, WL21 to WL2$n$, and SSL may be made of a conductive material, for example, a metal such as, for example, tungsten (W), cobalt (Co), copper (Cu), aluminum (Al), titanium (Ti), tantalum (Ta), or nickel (Ni) or a semiconductor material such as silicon (Si). However, the present disclosure is not limited thereto. For example, each of the gate electrodes ECL, GSL, WL11 to WL1$n$, WL21 to WL2$n$, and SSL may include a metal nitride (e.g., titanium nitride (TiN) or tantalum nitride (TaN)), a metal silicide (e.g., titanium silicide ($TiSi_2$), tungsten silicide ($WSi_2$), cobalt silicide ($CoSi_2$) or nickel silicide ($NiSi_2$)), or any combination thereof.

Each of the mold insulating films 110 and 115 may include an insulating material, for example, at least one of, for example, silicon oxide ($SiO_2$), silicon nitride ($Si_3N_4$), or silicon oxynitride (SiON). However, the present disclosure is not limited thereto.

In an embodiment of the present disclosure, the mold structure MS1 and MS2 in the through region THR may include a plurality of mold sacrificial films 112 and 117 and a plurality of mold insulating films 110 and 115 alternately stacked on the cell substrate 100 and/or the insulating substrate 101. Each of the mold sacrificial films 112 and 117 and each of the mold insulating films 110 and 115 may have a layered structure extending in a parallel manner to the upper surface of the cell substrate 100. The mold sacrificial films 112 and 117 may be sequentially stacked on the cell substrate 100 while being spaced apart from each other via each of the mold insulating films 110 and 115.

In an embodiment of the present disclosure, the first mold structure MS1 in the through region THR may include the first mold sacrificial films 112 and the first mold insulating films 110 alternately stacked on the cell substrate 100. The second mold structure MS2 in the through region THR may include the second mold sacrificial films 117 and the second mold insulating films 115 that are alternately stacked on the first mold structure MS1.

Each of the mold sacrificial films 112 and 117 may include an insulating material, for example, at least one of silicon oxide ($SiO_2$), silicon nitride ($Si_3N_4$), or silicon oxynitride (SiON). However, the present disclosure is not limited thereto. In an embodiment of the present disclosure, each of the mold sacrificial films 112 and 117 may include a material having an etch selectivity with respect to that of each of the mold insulating films 110 and 115. In one example, each of the mold insulating films 110 and 115 may include silicon oxide ($SiO_2$), and each of the mold sacrificial films 112 and 117 may include silicon nitride ($Si_3N_4$).

The interlayer insulating film 140a and 140b may be formed on the cell substrate 100 so as to cover the mold structure MS1 and MS2. In an embodiment of the present disclosure, the interlayer insulating film 140a and 140b may include the first interlayer insulating film 140a and the second interlayer insulating film 140b sequentially stacked on the cell substrate 100. The first interlayer insulating film 140a may cover the first mold structure MS1, and the second interlayer insulating film 140b may cover the second mold structure MS2. The interlayer insulating film 140a and 140b may include at least one of, for example, silicon oxide ($SiO_2$), silicon oxynitride (SiON), or a low-k material having a dielectric constant lower than that of the silicon oxide ($SiO_2$). However, the present disclosure is not limited thereto. In an embodiment of the present disclosure, the interlayer insulating film 140a and 140b may include, for example, a tetraethyl orthosilicate (TEOS) oxide layer. In an embodiment of the present disclosure, the interlayer insulating film 140a and 140b may include a carbon-doped silicon oxide (SiOCH) low dielectric constant (low-k) material.

The plurality of channel structures CH may be formed on the cell array region CAR of the cell substrate 100. Lower portions of the plurality of channel structures CH may be disposed in the cell substrate 100. Each of the channel structures CH may extend in a vertical direction (hereinafter, the third direction Z) intersecting the upper surface of the cell substrate 100 and may extend through the mold structure MS1 and MS2. For example, the channel structure CH may have a pillar shape (e.g., cylindrical shape) extending in the third direction Z. Accordingly, the channel structure CH may intersect each of the gate electrodes ECL, GSL, WL11 to WL1n, WL21 to WL2n, and SSL. In an embodiment of the present disclosure, each of the channel structures CH may have a stepped portion between the first mold structure MS1 and the second mold structure MS2.

As shown in FIG. 5, each channel structure CH may include a semiconductor pattern 130 and an information storage film 132.

The semiconductor pattern 130 may extend in the third direction Z and may extend through the mold structure MS1 and MS2. Although the semiconductor pattern 130 is illustrated only in a shape of a cup, this is only an example. In another example, the semiconductor pattern 130 may have various shapes, such as, for example, a cylindrical shape, a rectangular cylindrical shape, and a solid pillar shape. In an embodiment of the present disclosure, the semiconductor memory device may be a vertical NAND Flash memory device, and the semiconductor pattern 130 of each of the channel structures CH may serve as channels for an erase control transistor ECT, a ground select transistor GST, memory cell transistors MCT, and a string select transistor SST, in which these transistors constitute a NAND cell string. The semiconductor pattern 130 may include, for example, a semiconductor material such as single crystal silicon (sc-Si), polycrystalline silicon (p-Si), an organic semiconductor material, and a carbon (C) nano structure. However, the present disclosure is not limited thereto.

The information storage film 132 may be interposed between the semiconductor pattern 130 and each of the gate electrodes ECL, GSL, WL11 to WL1n, WL21 to WL2n, and SSL. For example, the information storage film 132 may extend along and on an outer face of the semiconductor pattern 130. The information storage film 132 may include at least one of, for example, silicon oxide ($SiO_2$), silicon nitride ($Si_3N_4$), silicon oxynitride (SiON), or a high dielectric constant material having a dielectric constant greater than that of silicon oxide ($SiO_2$). The high dielectric constant material may include, for example, aluminum oxide ($Al_2O_3$), hafnium oxide ($HfO_2$), lanthanum oxide ($La_2O_3$), tantalum oxide ($Ta_2O_5$), titanium oxide ($TiO_2$), zirconium oxide ($ZrO_2$), lanthanum hafnium oxide ($La_2Hf_2O_7$), lanthanum aluminum oxide ($LaAlO_3$), dysprosium scandium oxide ($DyScO_3$), barium titanium oxide ($BaTiO_3$), strontium titanium oxide ($SrTiO_3$), and combinations thereof.

In an embodiment of the present disclosure, the information storage film 132 may be composed of a multilayer. For example, as shown in FIG. 5, the information storage film 132 may include a tunnel insulating film 132a, a charge storage film 132b, and a blocking insulating film 132c that are sequentially stacked on an outer face of the semiconductor pattern 130. For example, the tunnel insulating film 132a may be adjacent to each of the semiconductor pattern 130 and may surround the outer sidewall of each of the semiconductor pattern 130. The tunnel insulating film 132a may allow charges to tunnel to the charge storage film 132b through the process of Fowler-Nordheim (F-N) tunneling. The charge storage film 132b may be a charge trapping layer. The blocking insulating film 132c may be adjacent to the gate electrodes ECL, GSL, WL11 to WL1n, WL21 to WL2n, and SSL. For example, the blocking insulating film 132c may be between the charge storage film 132b and the gate electrodes ECL, GSL, WL11 to WL1n, WL21 to WL2n, and SSL.

The tunnel insulating film 132a may include, for example, silicon oxide (SiO₂) or a high dielectric constant material (e.g., aluminum oxide (Al₂O₃), or hafnium oxide (HfO₂)) having a dielectric constant higher than that of silicon oxide (SiO₂). The charge storage film 132b may include, for example, silicon nitride (Si₃N₄). The blocking insulating film 132c may include, for example, silicon oxide (SiO₂) or a high dielectric constant material (e.g., aluminum oxide (Al₂O₃), or hafnium oxide (HfO₂)) having a dielectric constant higher than that of silicon oxide (SiO₂).

In an embodiment of the present disclosure, the channel structure CH may further include a filling pattern 134. The filling pattern 134 may be formed to fill an inside of the cup-shaped semiconductor pattern 130. The filling pattern 134 may include an insulating material, for example, silicon oxide (SiO₂). However, the present disclosure is not limited thereto. Alternatively, the inner space surrounded by each of the cup-shaped semiconductor patterns 130 may not be filled with the filling pattern 134, and each of the cup-shaped semiconductor patterns 130 may include a hollow space or an air gap in the inner space defined by each of the cup-shaped semiconductor patterns 130.

In an embodiment of the present disclosure, the channel structure CH may further include a channel pad 136. The channel pad 136 may be formed to be connected to a top of the semiconductor pattern 130. The bit-line BL may be connected to the channel pad 136 through a bit-line contact 182 to be described. The channel pad 136 may include a conductive material or a semiconductor material doped with dopants of which a conductivity type is different from that of the semiconductor pattern 130. For example, the channel pad 136 may include, for example, polysilicon (p-Si) doped with impurities. However, the present disclosure is not limited thereto.

In an embodiment of the present disclosure, the plurality of channel structures CH may be arranged in a zigzag manner. For example, as shown in FIG. 3, the plurality of channel structures CH may be arranged in a zigzag manner in the first direction Y and the second direction X parallel to the upper surface of the cell substrate 100. The plurality of channel structures CH arranged in the zigzag manner may further enhance integration density of the semiconductor memory device. The number and arrangement of the channel structures CH are merely examples and are not limited thereto. In an embodiment of the present disclosure, the plurality of channel structures CH may be arranged in a honeycomb manner or a matrix manner.

The source layer 102 may be partially recessed in the cell substrate 100. The source layer 102 may be interposed between the cell substrate 100 and the mold structure MS1 and MS2. For example, the source layer 102 may extend conformally (e.g., at a substantially uniform thickness) along and on the upper surface of the cell substrate 100. In an embodiment of the present disclosure, the source layer 102 may be formed on the cell array region CAR of the cell substrate 100 and extending into the extension region EXT1 and EXT2 of the cell substrate 100. In an embodiment of the present disclosure, the source layer 102 may be formed on the cell array region CAR of the cell substrate 100, and may not be formed on the extension region EXT1 and EXT2 of the cell substrate 100.

The source layer 102 may be connected to the semiconductor pattern 130 of each channel structure CH. For example, as shown in FIG. 5, the source layer 102 may extend through the information storage film 132 and may contact a side surface of the semiconductor pattern 130. The source layer 102 may act as the common source line (e.g., CSL of FIG. 2) of the semiconductor memory device. The source layer 102 may include a conductive material, for example, polysilicon (p-Si) or metal doped with impurities. However, the present disclosure is not limited thereto.

In an embodiment of the present disclosure, a portion of the source layer 102 adjacent to the semiconductor pattern 130 may have a shape protruding toward the information storage film 132. For example, the portion of the source layer 102 adjacent to the semiconductor pattern 130 may protrude upward to replace a portion of the information storage film 132 interposed between the semiconductor pattern 130 and the support layer 104, and may protrude down to replace a portion of the information storage film 132 interposed between the semiconductor pattern 130 and the cell substrate 100. For example, in a region adjacent to the semiconductor pattern 130, a length by which the source layer 102 extends in the third direction Z may be larger. Accordingly, the source layer 102 may contact the semiconductor pattern 130 over a larger region.

In an embodiment of the present disclosure, the channel structure CH may extend through the source layer 102. For example, a bottom of the channel structure CH may be recessed in the cell substrate 100 and under the source layer 102.

A base insulating film may be interposed between the cell substrate 100 and the source layer 102. The base insulating film may include, for example, at least one of silicon oxide (SiO₂), silicon nitride (Si₃N₄), or silicon oxynitride (SiON). However, the present disclosure is not limited thereto.

The source sacrificial layer 103 may be formed on the extension region EXT1 and EXT2 of the cell substrate 100. The source sacrificial layer 103 may be interposed between the mold structure MS1 and MS2 and the cell substrate 100. For example, the source sacrificial layer 103 may extend conformally (e.g., at a substantially uniform thickness) along and on the upper surface of the cell substrate 100. In an embodiment of the present disclosure, the source sacrificial layer 103 may be formed on the extension region EXT1 and EXT2 of the cell substrate 100, and may not be formed on the cell array region CAR of the cell substrate 100.

The source sacrificial layer 103 and the source layer 102 may be disposed at the same vertical level. As used herein, the phrase "being disposed at the same vertical level" means being disposed at the same vertical level based on the upper surface of the cell substrate 100. For example, a bottom surface of the source sacrificial layer 103 may be disposed at a vertical level the same as that of a bottom surface of the source layer 102.

In an embodiment of the present disclosure, the source layer 102 and/or the source sacrificial layer 103 may not be formed on the insulating substrate 101.

Although it is illustrated that a vertical level of an upper surface of the insulating substrate 101 is higher than that of each of an upper surface of the source layer 102 and/or an upper surface of the source sacrificial layer 103, this is only an example. In another example, the upper surface of the insulating substrate 101 may be coplanar with the upper surface of the source layer 102 and/or the upper surface of the source sacrificial layer 103.

The source sacrificial layer 103 may be a layer remaining after a portion thereof is replaced with the source layer 102. In this case, a thickness of the source layer 102 may be the same as a thickness of the source sacrificial layer 103. As used herein, "the same" means not only exactly the same, but also includes an insignificant difference that may occur due to a margin on a process. For example, the upper surface of the source sacrificial layer 103 may be disposed at a vertical level the same as that of the upper surface of the source layer 102.

The source sacrificial layer 103 may include an insulating material including at least one of, for example, silicon oxide (SiO$_2$), silicon nitride (Si$_3$N$_4$), or silicon oxynitride (SiON). However, the present disclosure is not limited thereto. In an embodiment of the present disclosure, the source sacrificial layer 103 may include a material having an etch selectivity with respect to that of each of the mold insulating films 110 and 115. In one example, each of the mold insulating films 110 and 115 may include silicon oxide (SiO$_2$), and the source sacrificial layer 103 may include silicon nitride (Si$_3$N$_4$).

In an embodiment of the present disclosure, the source sacrificial layer 103 may be composed of a multilayer. For example, as shown in FIG. 5, the source sacrificial layer 103 may include a first sacrificial layer 103a, a second sacrificial layer 103b, and a third sacrificial layer 103c sequentially stacked on the upper surface of the cell substrate 100. The second sacrificial layer 103b may include a material different from that of each of the first sacrificial layer 103a and the third sacrificial layer 103c. In one example, each of the first sacrificial layer 103a and the third sacrificial layer 103c may include silicon oxide (SiO$_2$), while the second sacrificial layer 103b may include silicon nitride (Si$_3$N$_4$). In an embodiment of the present disclosure, a thickness of the second sacrificial layer 103b may be greater than each of a thickness of the first sacrificial layer 103a and a thickness of the third sacrificial layer 103c.

The support layer 104 may be formed on the cell substrate 100, the source layer 102 and the source sacrificial layer 103. The support layer 104 may be interposed between the source layer 102 and the mold structure MS1 and MS2 and between the source sacrificial layer 103 and the mold structure MS1 and MS2. For example, the support layer 104 may extend conformally (e.g., at a substantially uniform thickness) along and on the upper surface of the cell substrate 100, the upper surface of the source layer 102, and the upper surface of the source sacrificial layer 103.

The source sacrificial layer 103 may include a material having an etch selectivity with respect to a material of the support layer 104. In one example, the source sacrificial layer 103 may include silicon nitride (Si$_3$N$_4$), and the support layer 104 may include polysilicon (p-Si).

The support layer 104 may include a support structure 104S in contact with the upper surface of the cell substrate 100. For example, the source layer 102 and/or the source sacrificial layer 103 may expose a portion of the upper surface of the cell substrate 100. The support structure 104S may extend along and on an exposed portion of the upper surface of the cell substrate 100 and contact the upper surface of the cell substrate 100.

At least a portion of the support structure 104S may be disposed on the extension region EXT1 and EXT2 and may have a mesh shape in a plan view. The support structure 104S having the mesh shape may firmly support the mold structure MS1 and MS2 in a replacement process for forming the source layer 102, thereby effectively preventing the mold structure MS1 and MS2 from collapsing in the replacement process. In an embodiment of the present disclosure, the support structure 104S surrounding the cell array region CAR may function as an etch stop layer in preventing the source sacrificial layer 103 on the extension region EXT1 and EXT2 being removed in the replacement process. Further, the support structure 104S having the mesh shape may prevent the support layer 104 from being lifted off or torn off during an inspection process of the semiconductor memory device, thereby enhancing inspection efficiency of the semiconductor memory device. This will be described later in more detail in descriptions of FIG. 23A and FIG. 23B.

As shown in FIGS. 3 and 4, the support structure 104S may include a plurality of first extensions 104x that extend in the second direction X and are arranged side by side and are disposed on the first region EXT1 and are spaced apart from each other. In one example, the first extensions 104x may include a first inner extension 104xi, a plurality of first middle extensions 104xm and a first outer extension 104xo which are sequentially arranged from the cell array region CAR. Further, for example, as shown in FIG. 3 and FIG. 8, the support structure 104S may include a plurality of second extensions 104y which are arranged side by side and extend in the first direction Y and are disposed on the second region EXT2 and are spaced apart from each other. In one example, the second extensions 104y may include a second inner extension 104yi and a second outer extension 104yo sequentially arranged from the cell array region CAR. The first and second inner extensions 104xi and 104yi may be disposed close to or right at a boundary between the cell array region and the extension region EXT1 and EXT2. The first extensions 104x and the second extensions 104y may intersect each other while being disposed on the extension region EXT1 and EXT2 so as to form a mesh portion 104x and 104y having the mesh shape. The number and arrangement of the first extensions 104x and the second extensions 104y are merely examples and are not limited thereto.

In an embodiment of the present disclosure, at least a portion of the first inner extension 104xi may overlap with a distal end of a gate electrode (e.g., the string select line SSL) as the topmost one of the gate electrodes ECL, GSL, WL11 to WL1n, WL21 to WL2n, and SSL. As used herein, the term "overlap" means overlap in the third direction Z.

In an embodiment of the present disclosure, at least a portion of the first outer extension 104xo may overlap with a distal end of a gate electrode (e.g., the erase control line ECL) as the bottommost one of the gate electrodes ECL, GSL, WL11 to WL1n, WL21 to WL2n, and SSL.

A spacing between adjacent ones of the first extensions 104x in the first direction Y may be, for example, in a range of about 0.1 μm to about 10 μm. However, the present disclosure is not limited thereto. For example, the spacing between adjacent ones of the first extensions 104x in the first direction Y may be in a range of about 1 μm to about 5 μm. It is illustrated that the spacings between adjacent ones of the first extensions 104x in the first direction Y are the same as each other. However, this is only an example. In another example, the spacings between adjacent ones of the first extensions 104x in the first direction Y may be different from each other. A distance by which the first inner extension 104xi is spaced apart from the first middle extensions 104xm may be different from a distance by which the first outer extension 104xo is spaced apart from the first middle extensions 104xm.

In an embodiment of the present disclosure, at least a portion of the second inner extension 104yi may overlap with a distal end of a gate electrode (e.g., the string select line SSL) as the topmost one of the gate electrodes ECL, GSL, WL11 to WL1n, WL21 to WL2n, and SSL.

In an embodiment of the present disclosure, at least a portion of the second outer extension 104yo may overlap with a distal end of a gate electrode (e.g., the erase control line ECL) as the bottommost one of the gate electrodes ECL, GSL, WL11 to WL1n, WL21 to WL2n, and SSL.

At least a portion of the support structure 104S may surround the cell array region CAR in the plan view. The support structure 104S surrounding the cell array region CAR may function as an etch stop layer such that the source sacrificial layer 103 on the extension region EXT1 and EXT2 is not removed (that is, the source sacrificial layer 103 on the extension region EXT1 and EXT2 is not replaced with the source layer 102) in the replacement process for forming the source layer 102. Accordingly, after the formation of the source layer 102, at least a portion of the support structure 104S may be interposed between the source layer 102 and the source sacrificial layer 103. This will be described later in more detail in descriptions with respect to FIG. 26 to FIG. 31.

As shown in FIG. 3, FIG. 4 and FIG. 8, the support structure 104S may include the first inner extension 104xi adjacent to the cell array region CAR among the first extensions 104x, and the second inner extension 104yi adjacent to the cell array region CAR among the second extensions 104y. The first inner extension 104xi may be disposed on each of both opposing sides in the first direction Y of the cell array region CAR. The second inner extension 104yi may be disposed on each of both opposing sides in the second direction X of the cell array region CAR. Thus, the first inner extensions 104xi and the second inner extensions 104yi may intersect each other at four corners of the four sides surrounding the cell array region CAR. The first inner extensions 104xi and the second inner extensions 104yi may be connected to each other to constitute a peripheral portion 104xi and 104yi completely surrounding the cell array region CAR. For example, the peripheral portion 104xi and 104yi may continuously extend along one first inner extension 104xi, one second inner extension 104yi, the other first inner extension 104xi opposite to the one first inner extension 104xi, the other second inner extension 104yi opposite to the one second inner extension 104yi, and back to the one first inner extension 104xi, so as to surround the cell array region CAR in a plan view of the semiconductor memory device.

A width (e.g., W11 of FIG. 5) of the support structure 104S may be, for example, about in a ranger of 10 nm to about 1,000 nm. However, the present disclosure is not limited thereto. For example, the width (e.g., W11 of FIG. 5) of the support structure 104S may be in a range of about 100 nm to about 500 nm. It is illustrated that the width of each of the first extensions 104x and the width of each of the second extensions 104y are equal to each other. However, this is only an example. In another example, the widths of the first extensions 104x may be different from each other, and the widths of the second extensions 104y may be different from each other. In still another example, the width of each of the first extensions 104x may be different from the width of each of the second extensions 104y.

The block isolation region WC may extend in the second direction X so as to cut the mold structure MS1 and MS2. Further, a plurality of block isolation regions WC may be spaced apart from each other and may be arranged side by side and may extend in the second direction X. The mold structure MS1 and MS2 may be divided into a plurality of memory cell blocks (e.g., BLK1 to BLKn in FIG. 1) via the block isolation regions WC. The plurality of memory cell blocks (e.g., BLK1 to BLKn in FIG. 1) may be spaced apart from each other in the first direction Y by the block isolation regions WC. The block isolation region WC may include an insulating material including at least one of, for example, silicon oxide (SiO$_2$), silicon nitride (Si$_3$N$_4$), or silicon oxynitride (SiON). However, the present disclosure is not limited thereto.

The block isolation region WC may cut the source layer 102 and the support layer 104. Although a bottom surface of the block isolation region WC is shown to be coplanar with a bottom surface of the source layer 102, this is only an example. In another example, a vertical level of the bottom surface of the block isolation region WC may be lower than that of the upper surface of the cell substrate 100.

At least a portion of the support structure 104S may overlap the block isolation region WC on the extension region EXT1 and EXT2. For example, as shown in FIG. 3, FIG. 6 and FIG. 7, the support structure 104S may include a first block isolation region-inserted portion 104w overlapping the block isolation region WC on the second region EXT2. The block isolation region WC on the second region EXT2 may cut a first block isolation region-inserted portion 104w. As shown in FIG. 7, a width W12 of the first block isolation region-inserted portion 104w may be greater than a width W2 of the block isolation region WC. The first block isolation region-inserted portion 104w may function as an etch stop layer such that the source sacrificial layer 103 on the second region EXT2 is not removed (that is, the source sacrificial layer 103 on the second region EXT2 is not replaced with the source layer 102) in the replacement process for forming the source layer 102.

The bit-line BL may be formed on the mold structure MS1 and MS2. Further, the plurality of bit-lines BL may be spaced apart from each other and may be arranged side by side and may extend in the first direction Y. Each bit-line BL may be connected to at least some of the plurality of channel structures CH. For example, a bit-line contact 182 connected to a top of each channel structure CH may be formed in the second interlayer insulating film 140b. The bit-line BL may be electrically connected to the channel structures CH arranged along the first direction Y via the bit-line contact 182. For example, the bit-line contact 182 may include at least one of a metal material (e.g., copper (Cu) or tungsten (W)) or a metal nitride material (e.g., titanium nitride (TiN), tantalum nitride (TaN), or tungsten nitride (WN)).

The cell contact 162 may be connected to each of the gate electrodes ECL, GSL, WL11 to WL1n, WL21 to WL2n, and SSL. For example, the cell contact 162 may be disposed on the mold structure MS1 and MS2 and may extend in the third direction Z and may be connected to each of the gate electrodes ECL, GSL, WL11 to WL1n, WL21 to WL2n, and SSL. In an embodiment of the present disclosure, the cell contact 162 may have a stepped portion between the first mold structure MS1 and the second mold structure MS2. The cell contacts 162 may be in direct contact with top surfaces of the end portions of the gate electrodes ECL, GSL, WL11 to WL1n, WL21 to WL2n, and SSL. The cell contacts 162 may include at least one of a metal material (e.g., copper (Cu) or tungsten (W)) or a metal nitride material (e.g., titanium nitride (TiN), tantalum nitride (TaN), or tungsten nitride (WN)).

The substrate contact 164 may be connected to the cell substrate 100. For example, the substrate contact 164 may be disposed on a portion of the cell substrate 100 exposed through the mold structure MS1 and MS2 and may extend in the third direction Z and may be connected to the cell substrate 100. In an embodiment of the present disclosure, the substrate contact 164 may have a stepped portion between the first mold structure MS1 and the second mold structure MS2.

The through-via 166 may be disposed in the through region THR. For example, the through-via 166 may be disposed on the insulating substrate 101 in the through region THR and may extend in the third direction Z. In an embodiment of the present disclosure, the through-via 166 may have a stepped portion between the first mold structure MS1 and the second mold structure MS2. Although the through-via 166 is only shown to extend through the mold structure MS1 and MS2, this is only an example. In another example, the through-via 166 may be disposed outside the mold structure MS1 and MS2 so as not to extend through the mold structure MS1 and MS2.

Each of the cell contact 162, the substrate contact 164, and the through-via 166 may be connected to the first line structure 180 on the interlayer insulating film 140a and 140b. For example, a first interline insulating film 142 may be formed on the second interlayer insulating film 140b. The first line structure 180 may be formed in the first interline insulating film 142. Each of the cell contact 162, the substrate contact 164, and the through-via 166 may be connected to the first line structure 180 via a contact via 184. In an embodiment of the present disclosure, the first line structure 180 may be connected to the bit-line BL.

The peripheral circuit region PERI may include a peripheral circuit substrate 200, a peripheral circuit element PT, and a second line structure 260.

The peripheral circuit substrate 200 may include, for example, a semiconductor substrate such as a silicon (Si) substrate, a germanium (Ge) substrate, a silicon-germanium (SiGe) substrate, a III-V compound semiconductor substrate, a single-crystalline epitaxial layer grown on a single-crystalline silicon (Si) substrate, or a combination thereof. Any suitable III-V compound semiconductor may be used for the cell substrate 100 and may include, for example, gallium phosphide (GaP), gallium arsenide (GaAs), gallium antimonide (GaSb), indium arsenide (InAs), indium antimonide (InSb), lead tellurium (PbTe) compounds, indium phosphide (InP), indium gallium arsenide (InGaAs), or a combination thereof. Alternatively, the peripheral circuit substrate 200 may include a silicon-on-insulator (SOI) substrate or a germanium-on-insulator (GOI) substrate. In an embodiment of the present disclosure, the peripheral circuit substrate 200 may be disposed under the cell substrate 100. For example, an upper surface of the peripheral circuit substrate 200 may face a bottom surface of the cell substrate 100.

The peripheral circuit element PT may be formed on the peripheral circuit substrate 200. The peripheral circuit element PT may constitute the peripheral circuit (e.g., 30 in FIG. 1) that controls an operation of the semiconductor memory device. For example, the peripheral circuits disposed in the peripheral circuit region PERI may be circuits that process data input to or output from the memory cell region CELL at high speed. For example, the peripheral circuit element PT may include the control logic (e.g., 37 in FIG. 1), the row decoder (e.g., 33 in FIG. 1), and the page buffer (e.g., 35 in FIG. 1). In a following description, a surface of the peripheral circuit substrate 200 on which the peripheral circuit element PT is disposed may be referred to as a front surface of the peripheral circuit substrate 200. On the other hand, a surface of the peripheral circuit substrate 200 opposite to the front surface of the peripheral circuit substrate 200 may be referred to as a back surface of the peripheral circuit substrate 200.

The peripheral circuit element PT may include, for example, a transistor. The transistor may include a gate, a gate insulating layer and a source/drain region. However, the present disclosure is not limited thereto. For example, the peripheral circuit element PT may include various active elements such as transistors, as well as various passive elements such as capacitors, resistors, and inductors.

In an embodiment of the present disclosure, the back surface of the cell substrate 100 may face the front surface of the peripheral circuit substrate 200. For example, a second interline insulating film 240 covering the peripheral circuit element PT may be formed on the front surface of the peripheral circuit substrate 200. The cell substrate 100 and/or the insulating substrate 101 may be stacked on an upper surface of the second interline insulating film 240.

The first line structure 180 may be connected to the peripheral circuit element PT via the through-via 166. For example, the second line structure 260 connected to the peripheral circuit element PT may be formed in the second interline insulating film 240. The through-via 166 may extend in the third direction Z so as to connect the first line structure 180 and the second line structure 260 to each other. Accordingly, the bit-line BL and/or each of the gate electrodes ECL, GSL, WL11 to WL1n, WL21 to WL2n, and SSL may be electrically connected to the peripheral circuit element PT.

The insulating substrate 101 may be formed in at least a portion of the extension region EXT1 and EXT2 and in the through region THR. In an embodiment of the present disclosure, the through-via 166 may extend through the insulating substrate 101 so as to connect the first line structure 180 in the memory cell region CELL and the second line structure 260 in the peripheral circuit region PERI to each other. Thus, the through-via 166 may be electrically insulated from the cell substrate 100.

Figure 9:
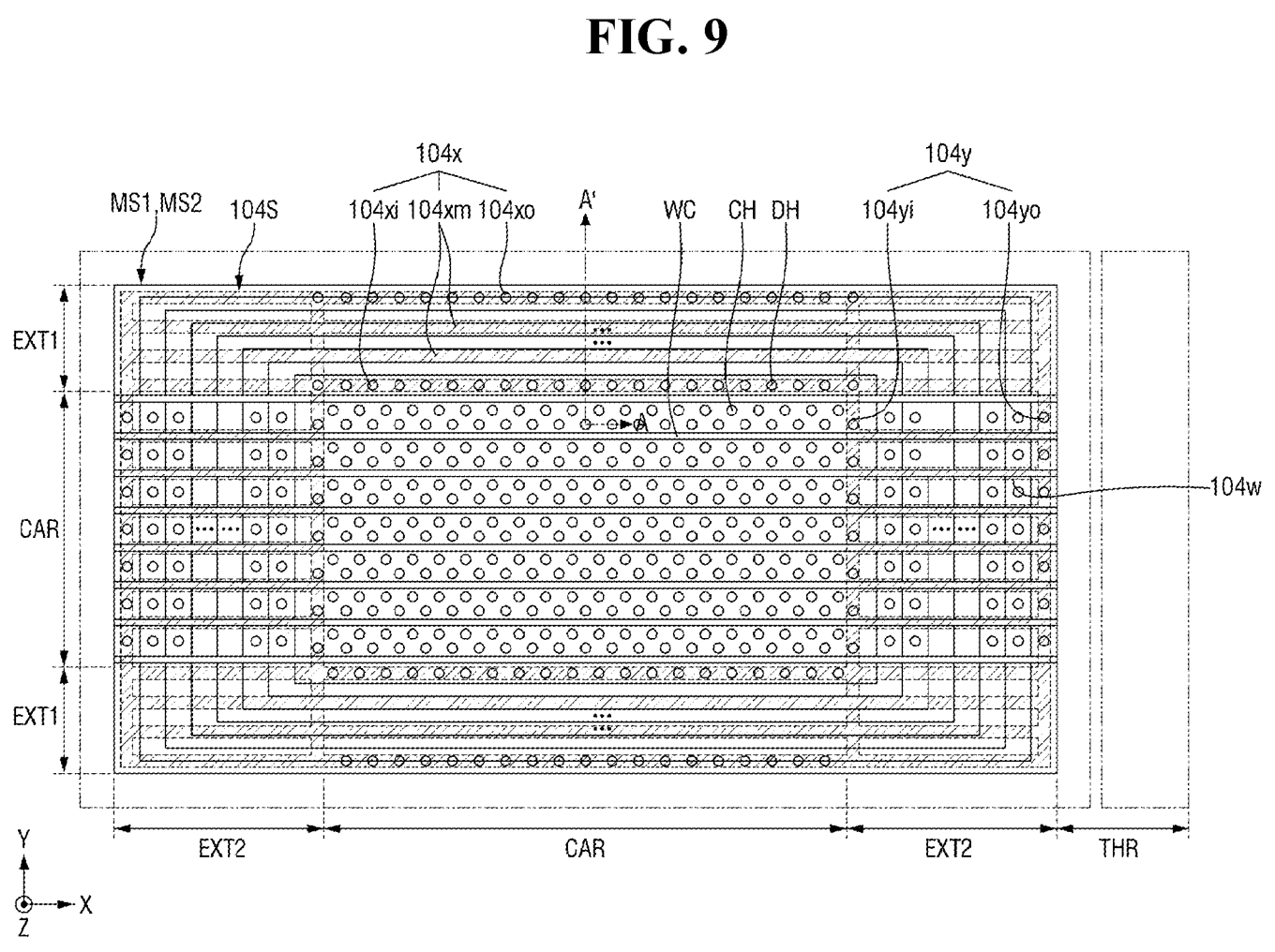
Figure 10:
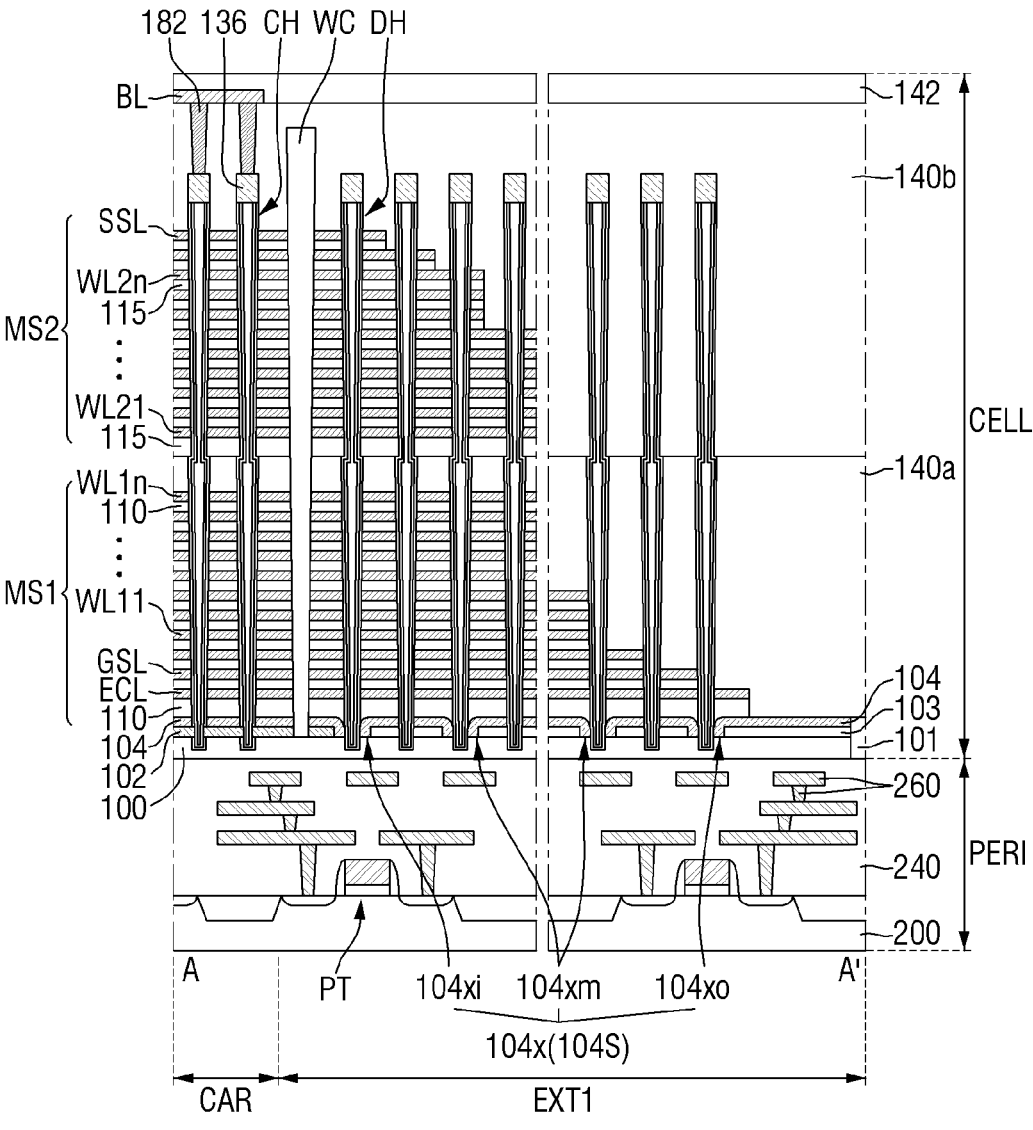
FIG. 10 is a cross-sectional view taken along A-A' of FIG. 9.

FIG. 9 is an exemplary layout diagram for illustrating a semiconductor memory device according to an embodiment of the present disclosure. FIG. 10 is a cross-sectional view taken along A-A' of FIG. 9. For convenience of illustration, parts duplicate with those as described above with reference to FIGS. 1 to 8 are briefly described or omitted.

Referring to FIGS. 9 and 10, the semiconductor memory device according to an embodiment of the present disclosure further includes a plurality of dummy channel structures DH.

The plurality of dummy channel structures DH may be formed on the extension region EXT1 and EXT2 of the cell substrate 100. Each of the dummy channel structures DH may extend in the third direction Z so as to extend through the mold structure MS1 and MS2. The dummy channel structure DH may be formed in a shape similar to that of the channel structure CH so as to reduce stress applied to the mold structure MS1 and MS2 in the extension region EXT1 and EXT2. For example, each dummy channel structure DH may include the semiconductor pattern 130 and the information storage film 132 as described above with reference to FIG. 5.

The source layer 102 may not be connected to the semiconductor pattern 130 of each of the dummy channel structures DH. Accordingly, the dummy channel structures DH may not constitute the memory cell array (e.g., 20 in FIG. 1) of the semiconductor memory device.

In an embodiment of the present disclosure, a portion of the support structure 104S may overlap at least some of the plurality of dummy channel structures DH. For example, as shown in FIG. 9 and FIG. 10, at least some of the plurality of dummy channel structures DH may extend through at least some of the first extensions 104x and/or at least some of the second extensions 104y.

In an embodiment of the present disclosure, at least some of the plurality of dummy channel structures DH may overlap with a distal end of a gate electrode (e.g., the string select line SSL) as the topmost one among the gate electrodes ECL, GSL, WL11 to WL1$n$. WL21 to WL2$n$, and SSL. The dummy channel structures DH may extend through the first inner extension 104$xi$ and/or the second inner extension 104$yi$. In an embodiment of the present disclosure, some of the dummy channel structures DH may extend through the first outer extension 104$xo$ and/or the second outer extension 104$yo$, and some of the dummy channel structures DH may extend through the support layer 104 and the source sacrificial layer 103.

FIGS. 11 to 15 are various exemplary layout diagrams for illustrating a semiconductor memory device each according to an embodiment of the present disclosure. For convenience of illustration, parts duplicate with those as described above with reference to FIGS. 1 to 10 are briefly described or omitted.

Figure 11:
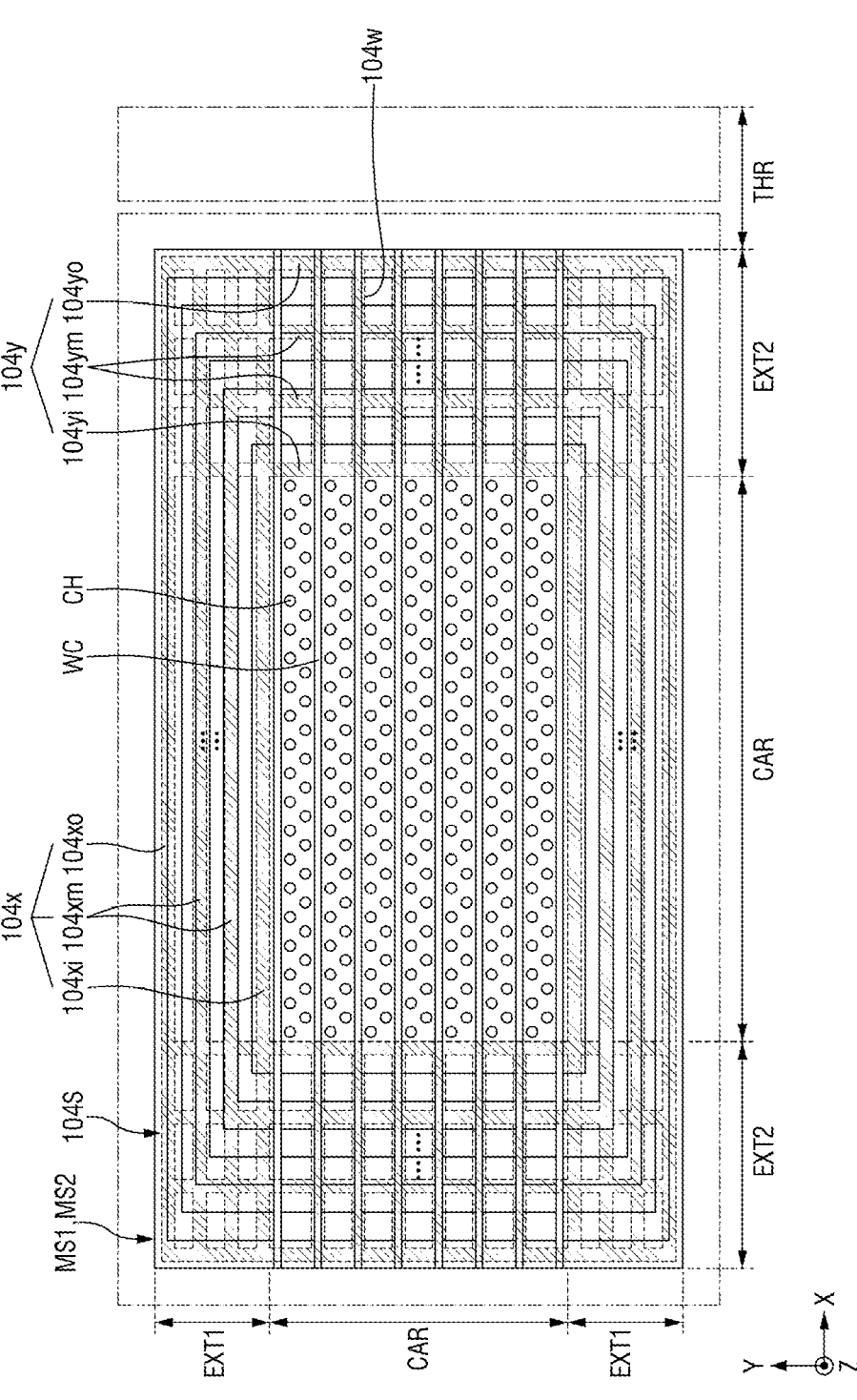
FIGS. 11 to 15 are various exemplary layout diagrams for illustrating a semiconductor memory device each according to an embodiment of the present disclosure.

Referring to FIG. 11, in a semiconductor memory device according to an embodiment of the present disclosure, the support structure 104S further includes a second middle extension 104$ym$.

In one example, the second extensions 104$y$ may include the second inner extension 104$yi$, a plurality of second middle extensions 104$ym$, and the second outer extension 104$yo$, which are sequentially arranged from the cell array region CAR. The number and arrangement of the second middle extension 104$ym$ are merely examples, and are not limited thereto.

The second extensions 104$y$ including the second middle extensions 104$ym$ may be formed in a mesh shape on the second region EXT2. In this case, by adding the second middle extensions 104$ym$ to the second extension 104$y$, the strength of the support structure 104S may increase. Accordingly, the support structure 104S may more firmly fix the support layer 104 in the replacement process for forming the source layer 102 and/or in the inspection process of the semiconductor memory device.

A distance by which adjacent ones of the second extensions 104$y$ are spaced apart from each other in the second direction X may be, for example, in a range of about 0.1 μm to about 1,000 μm. However, the present disclosure is not limited thereto. It is illustrated that the spacings between adjacent ones of the second extensions 104$y$ in the second direction X are the same as each other. However, this is only an example. In another example, the distances by which adjacent ones of the second extensions 104$y$ are spaced apart from each other in the second direction X may be different from each other. In one example, a distance by which the second inner extension 104$yi$ is spaced apart from the second middle extensions 104$ym$ may be different from a distance by which the second outer extension 104$yo$ is spaced apart from the second middle extensions 104$ym$.

Figure 12:
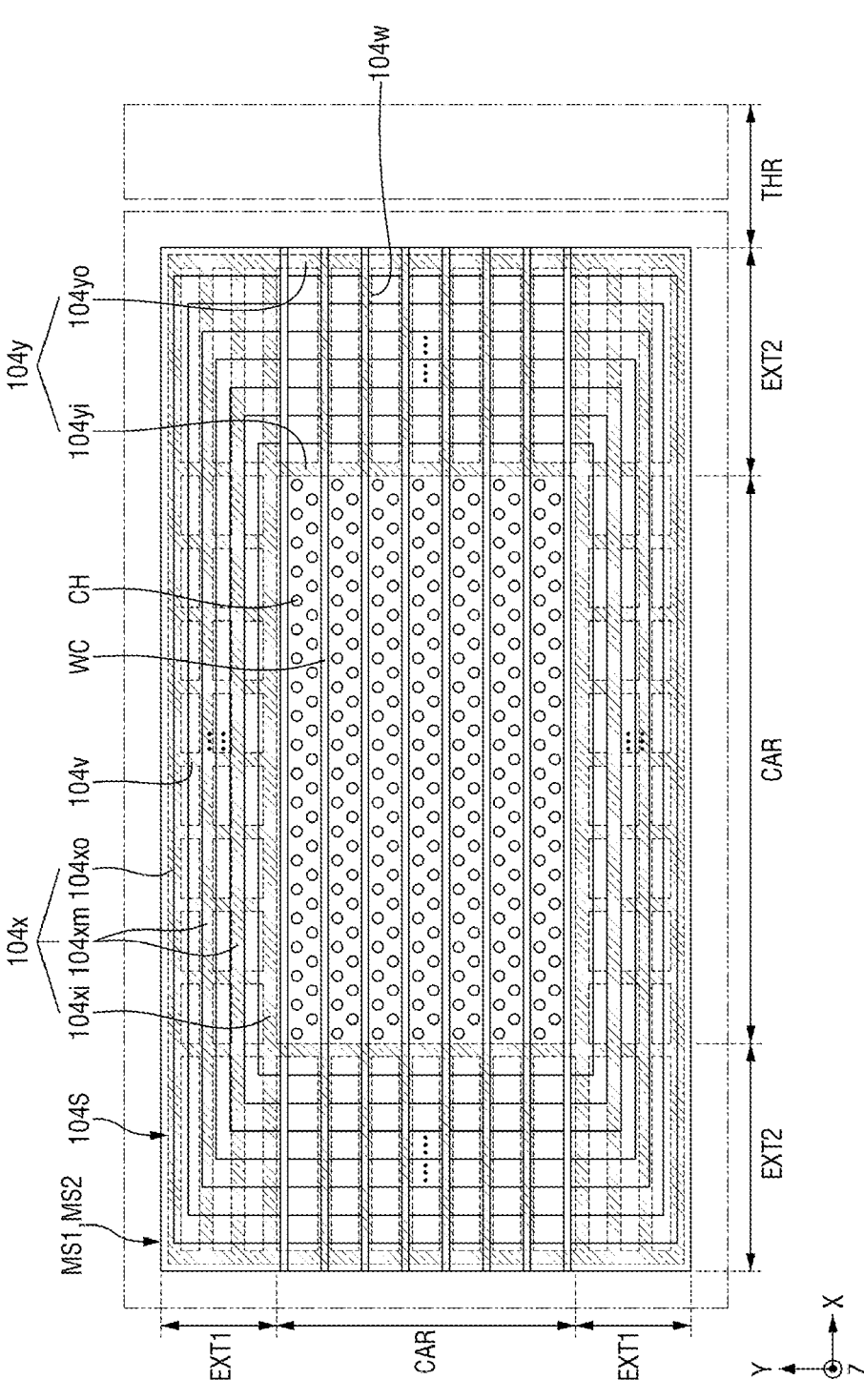

Referring to FIG. 12, in a semiconductor memory device according to an embodiment of the present disclosure, the support structure 104S further includes a second block isolation region-inserted portion 104$v$.

The second block isolation region-inserted portion 104$v$ may be disposed on the first region EXT1 and extend in the first direction Y. In an embodiment of the present disclosure, a plurality of the second block isolation region-inserted portions 104$v$ may be spaced apart from each other and may be disposed on the first region EXT1 and may be arranged side by side and may extend in the first direction Y. The number and arrangement of the second block isolation region-inserted portions 104$v$ are merely examples and are not limited thereto.

The first extensions 104$x$ and the second block isolation region-inserted portions 104$v$ disposed on the first region EXT1 may intersect each other to form a mesh shape. In this case, by adding the second block isolation region-inserted portions 104$v$ to the first extensions 104$x$, the strength of the support structure 104S may increase. Accordingly, the support structure 104S may more firmly fix the support layer 104 in the replacement process for forming the source layer 102 and/or in the inspection process of the semiconductor memory device.

Figure 13:
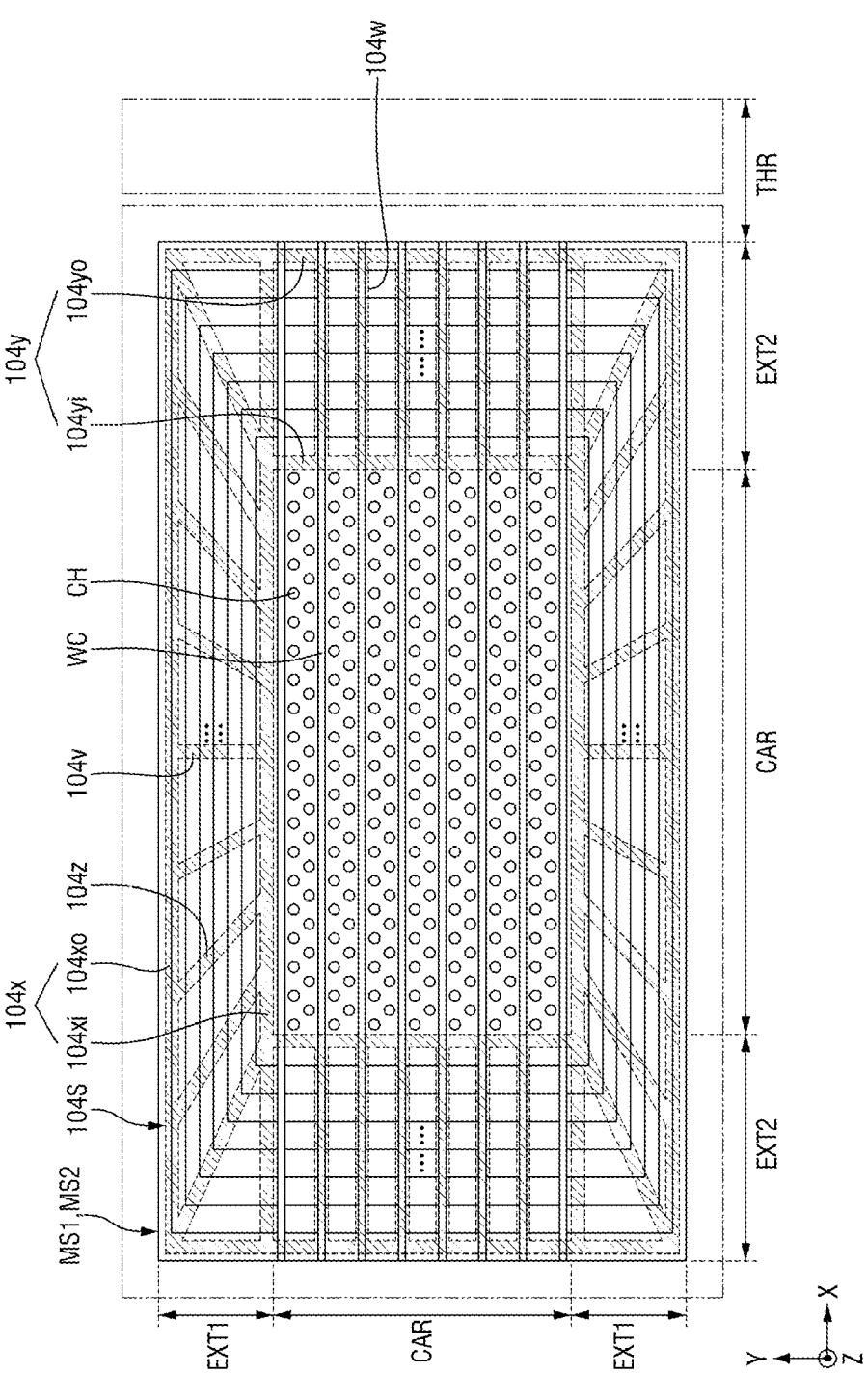

Referring to FIG. 13, in a semiconductor memory device according to an embodiment of the present disclosure, the support structure 104S further includes an inclined block isolation region-inserted portion 104$z$.

The inclined block isolation region-inserted portion 104$z$ may be formed on the first region EXT1. The inclined block isolation region-inserted portion 104$z$ may have an inclination with respect to the first direction Y and the second direction X. For example, the inclined block isolation region-inserted portion 104$z$ may extend in a diagonal direction different from the first direction Y and the second direction X. In an embodiment of the present disclosure, a plurality of inclined block isolation region-inserted portions 104$z$ may be spaced apart from each other and may be disposed on the first region EXT1 and may have different inclinations.

The first extensions 104$x$ and the inclined block isolation region-inserted portions 104$z$ may intersect each other to form a mesh shape on the first region EXT1. In this case, by adding the inclined block isolation region-inserted portions 104$z$ to the first extensions 104$x$, the strength of the support structure 104S may increase. Accordingly, the support structure 104S may more firmly fix the support layer 104 in the replacement process for forming the source layer 102 and/or in the inspection process of the semiconductor memory device.

It is shown that the first extensions 104$x$ do not include the first middle extensions 104$xm$. However, this is only an example. In another example, the inclined block isolation region-inserted portions 104$z$ may intersect the first middle extensions 104$xm$.

Figure 14:
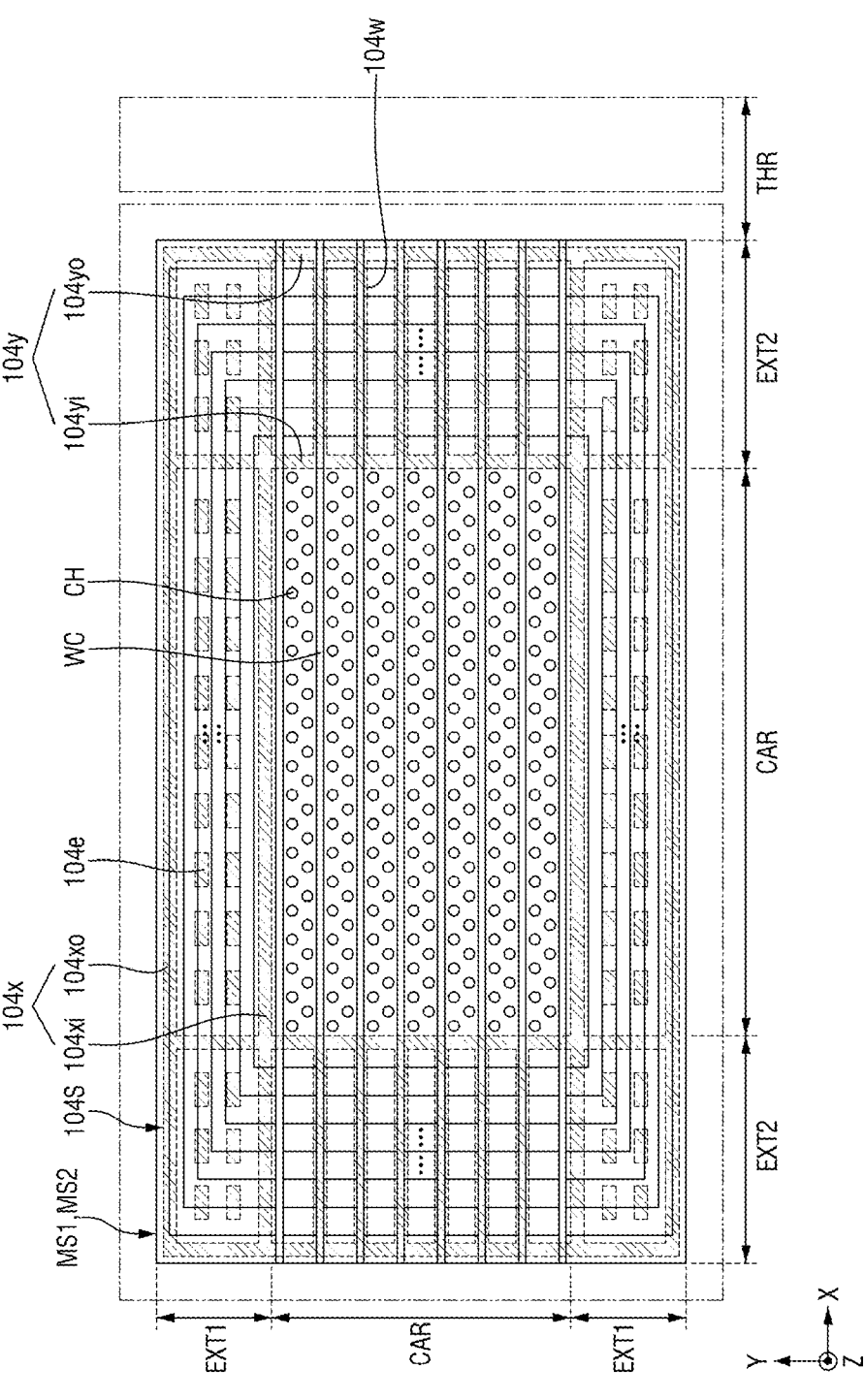

Referring to FIG. 14, in a semiconductor memory device according to an embodiment of the present disclosure, the support structure 104S further includes a plurality of first isolated portions 104$e$ on the extension region EXT1 and EXT2.

The first isolated portions 104$c$ may respectively constitute a plurality of isolated regions spaced apart from each other and disposed on the extension region EXT1 and EXT2. In one example, at least some of the first isolated portions 104$e$ may be arranged along the second direction X while being disposed between the first inner extension 104$xi$ and the first outer extension 104$xo$.

The first isolated portions 104$c$ may be disposed in an empty space of the support structure 104S having a mesh shape. In this case, by disposing the first isolated portions 104$e$ in an empty space of the support structure 104S, the strength of the support structure 104S may increase. Accordingly, the support structure 104S may more firmly fix the support layer 104 in the replacement process for forming the source layer 102 and/or in the inspection process of the semiconductor memory device.

Figure 15:
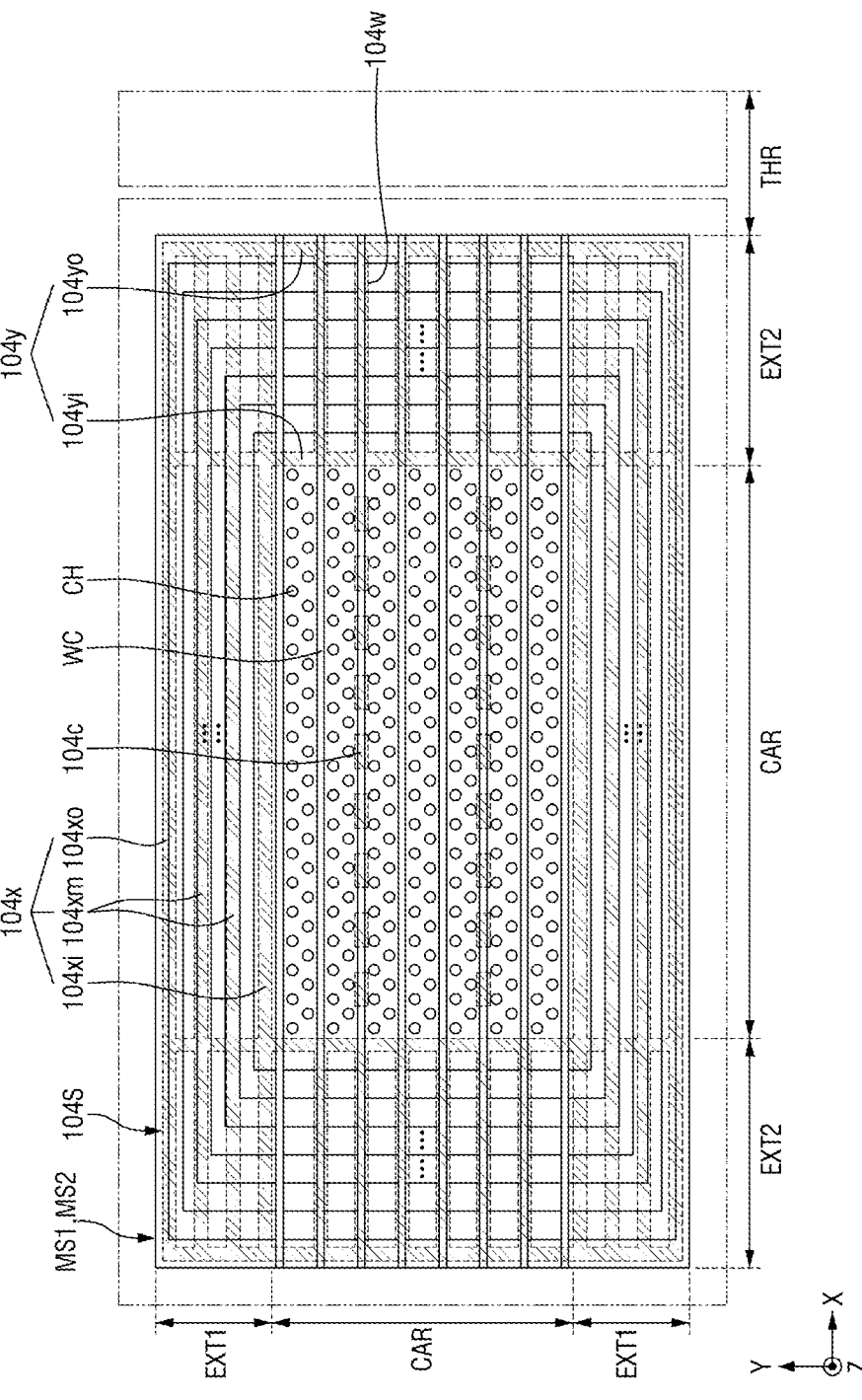

Referring to FIG. 15, in a semiconductor memory device according to an embodiment of the present disclosure, the support structure 104S further includes a plurality of second isolated portions 104c on the cell array region CAR.

The second isolated portions 104c may constitute a plurality of isolated regions spaced apart from each other and disposed on the cell array region CAR. In one example, at least some of the second isolated portions 104c may be arranged along the second direction X and may be disposed on the cell array region CAR. In an embodiment of the present disclosure, the second isolated portions 104c may horizontally overlap the block isolation region WC on the cell array region CAR.

The second isolated portions 104c may be disposed in an empty space of the support structure 104S having a mesh shape. In this case, by disposing the second isolated portions 104c in an empty space of the support structure 104S, the strength of the support structure 104S may increase. Accordingly, the support structure 104S may more firmly support the mold structure MS1 and MS2 during the replacement process for forming the source layer 102 and/or the inspection process of the semiconductor memory device.

Figure 16:
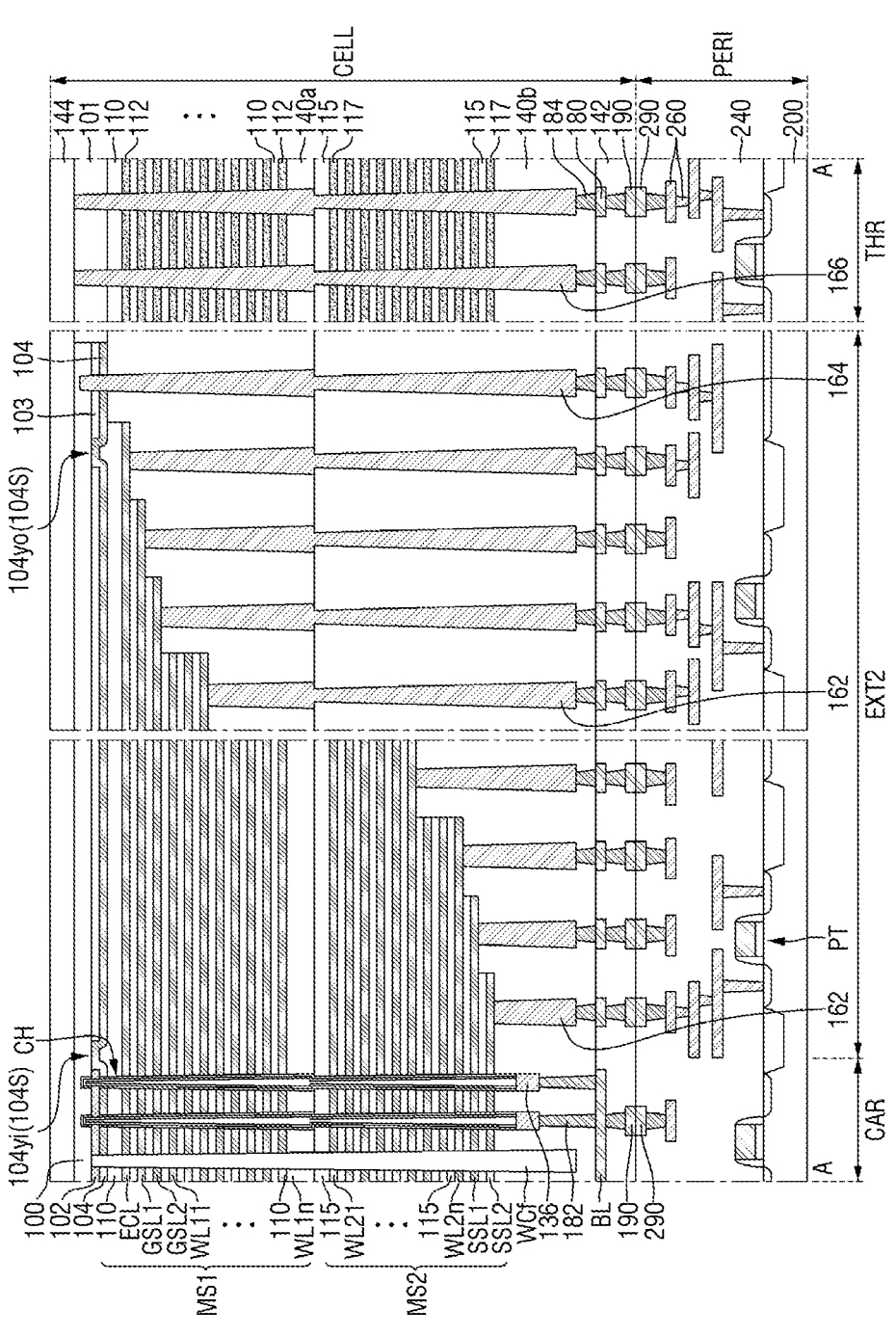
FIG. 16 is a cross-sectional view for illustrating a semiconductor memory device according to an embodiment of the present disclosure.

FIG. 16 is a cross-sectional view for illustrating a semiconductor memory device according to an embodiment of the present disclosure. For convenience of illustration, parts duplicate with those as described above with reference to FIGS. 1 to 15 are briefly described or omitted.

Referring to FIG. 16, in a semiconductor memory device according to an embodiment of the present disclosure, the front surface of the cell substrate 100 faces the front surface of the peripheral circuit substrate 200. For example, the mold structure MS1 and MS2 and the peripheral circuit element PT may be interposed between the cell substrate 100 and the peripheral circuit substrate 200.

The semiconductor memory device according to an embodiment of the present disclosure may have a chip to chip (C2C) structure. The C2C structure may refer to a structure in which an upper chip including the memory cell region CELL is disposed on a first wafer (e.g., the cell substrate 100), and a lower chip including the peripheral circuit region PERI is disposed on a second wafer (e.g., the peripheral circuit substrate 200) different from the first wafer, and then the upper chip and the lower chip are connected to each other in a bonding scheme.

In one example, the bonding scheme means a scheme for electrically connecting a first bonding metal 190 formed in an uppermost metal layer of the upper chip and a second bonding metal 290 formed in an uppermost metal layer of the lower chip to each other. For example, when each of the first bonding metal 190 and the second bonding metal 290 is made of copper (Cu), the bonding scheme may be embodied as a Cu—Cu bonding scheme. However, this is merely an example. In another example, each of the first bonding metal 190 and the second bonding metal 290 may be made of various other metals such as, for example, aluminum (Al) or tungsten (W). In an embodiment of the present disclosure, the first bonding metal 190 of the upper chip and the second bonding metal 290 of the lower chip may be connected directly to each other by a hybrid bonding method. For example, when the first and second bonding metals 190 and 290 are formed of copper (Cu), the first and second bonding metals 190 and 290 may be physically and electrically connected to each other by a copper (Cu)-copper (Cu) bonding method. In addition, a surface of the first interline insulating film 142 of the upper chip and a surface of the second interline insulating film 240 of the lower chip may be bonded to each other by a dielectric material-dielectric material bonding method.

As the first bonding metal 190 and the second bonding metal 290 are bonded to each other, the first line structure 180 may be connected to the second line structure 260. Accordingly, the bit-line BL and/or each of the gate electrodes ECL, GSL, WL11 to WL1n, WL21 to WL2n, and SSL may be electrically connected to the peripheral circuit element PT.

Hereinafter, a method of manufacturing a semiconductor memory device according to an embodiment of the present disclosure will be described with reference to FIGS. 17 to 22, 23a, 23b, and 24 to 32.

FIGS. 17 to 22, 23a, 23b, and 24 to 32 are diagrams of structures of intermediate steps for illustrating a method of manufacturing a semiconductor memory device according to an embodiment of the present disclosure. For convenience of illustration, parts duplicate with those as described above with reference to FIGS. 1 to 16 are briefly described or omitted.

Figure 17:
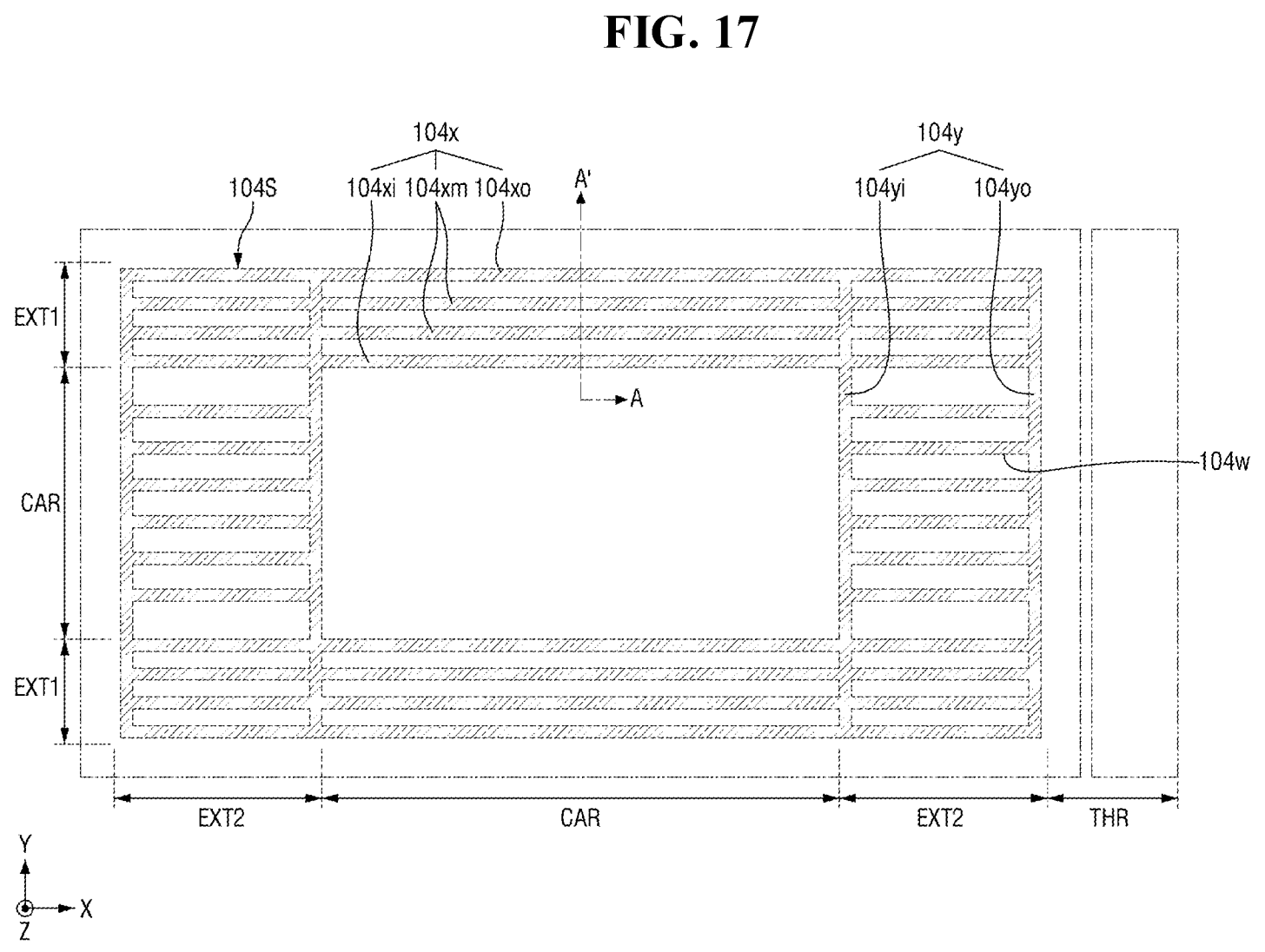
Figure 18:
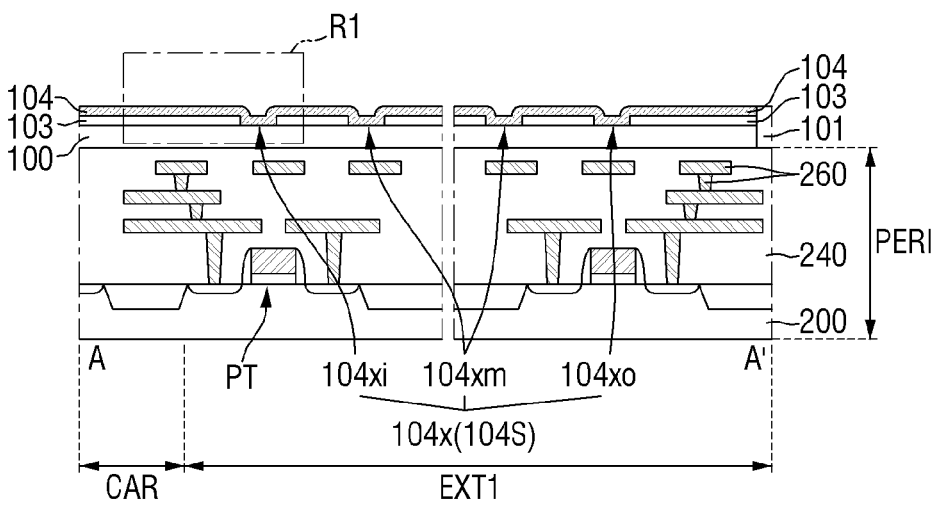
Figure 19:
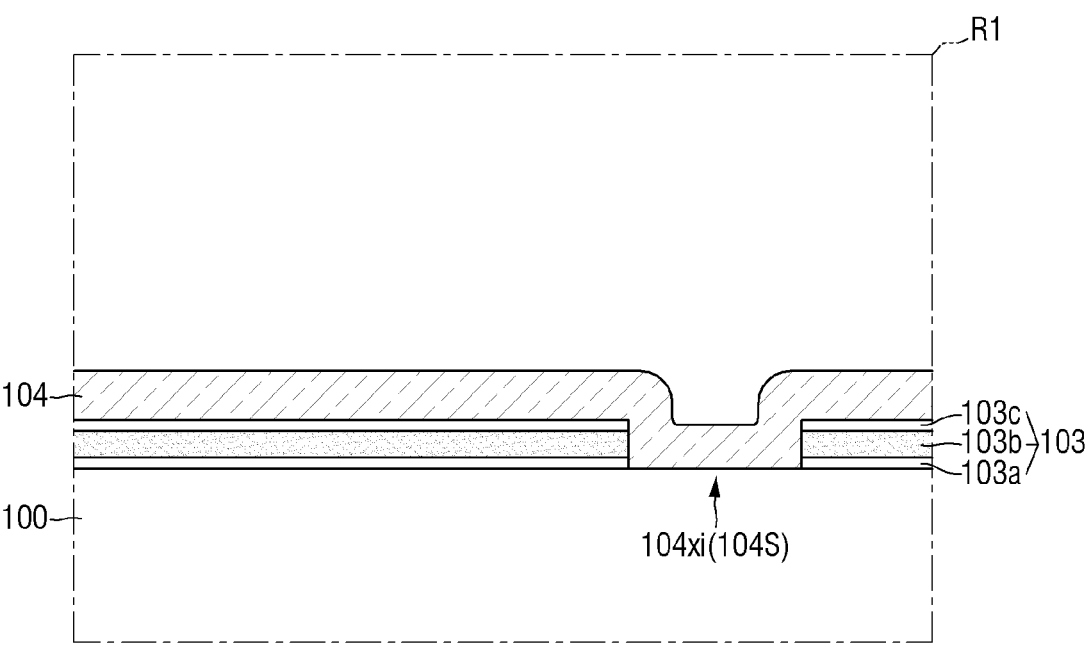

Referring to FIGS. 17 to 19, the source sacrificial layer 103 and the support layer 104 are formed on the cell substrate 100 and/or the insulating substrate 101.

The source sacrificial layer 103 and the support layer 104 may be sequentially stacked on the cell substrate 100 and/or the insulating substrate 101. The source sacrificial layer 103 may include a material having an etch selectivity with respect to that of the support layer 104. In one example, the source sacrificial layer 103 may include silicon nitride ($Si_3N_4$), and the support layer 104 may include polysilicon (p-Si).

In an embodiment of the present disclosure, the source sacrificial layer 103 may be composed of a multilayer. For example, as shown in FIG. 19, the source sacrificial layer 103 may include the first sacrificial layer 103a, the second sacrificial layer 103b, and the third sacrificial layer 103c sequentially stacked on the upper surface of the cell substrate 100.

The source sacrificial layer 103 may be patterned to expose a portion of the upper surface of the cell substrate 100. The support layer 104 may be formed on the cell substrate 100 and the patterned source sacrificial layer 103. Accordingly, the support layer 104 may include the support structure 104S in contact with the upper surface of the cell substrate 100.

Figure 20:
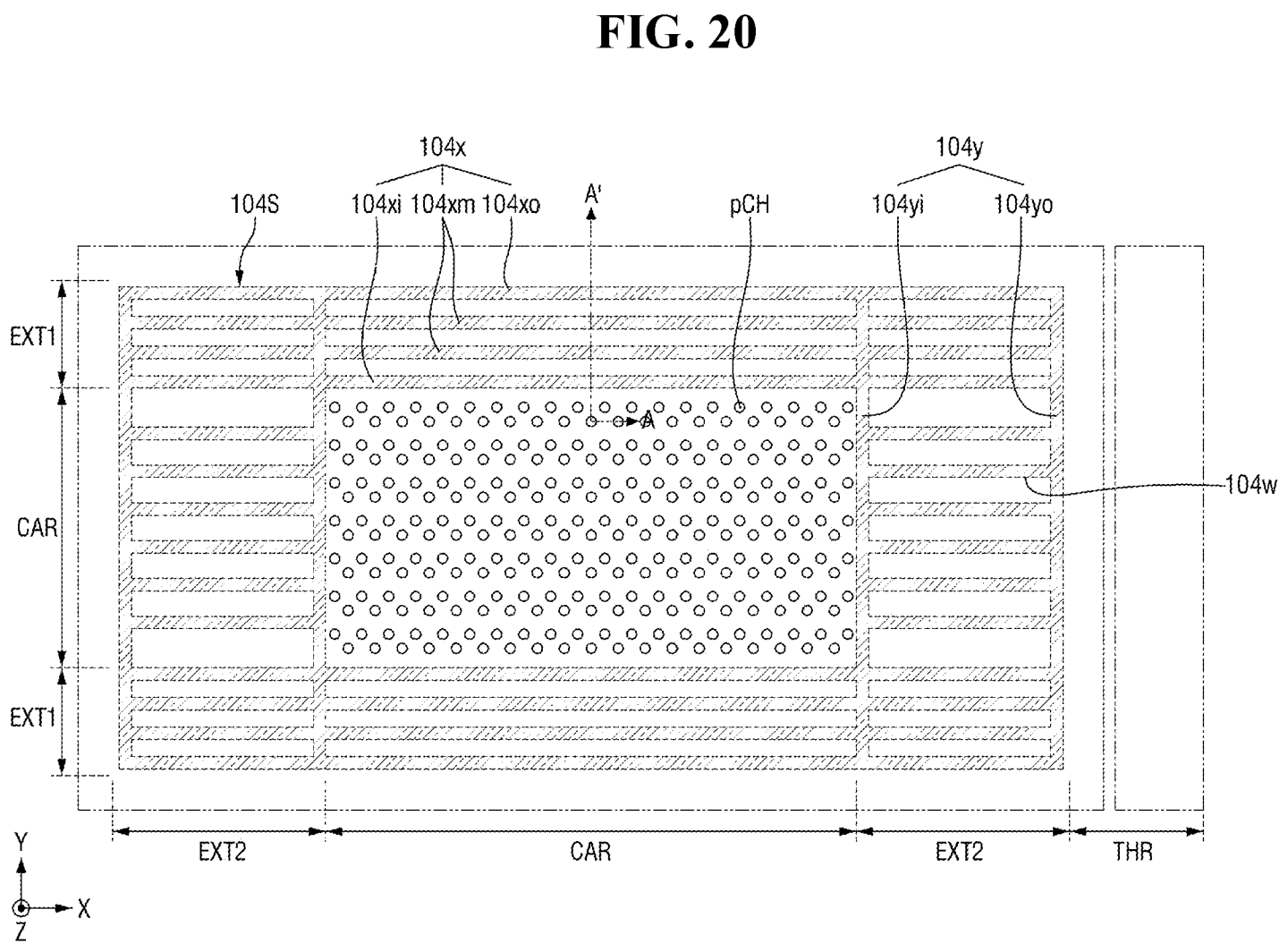
Figure 21:
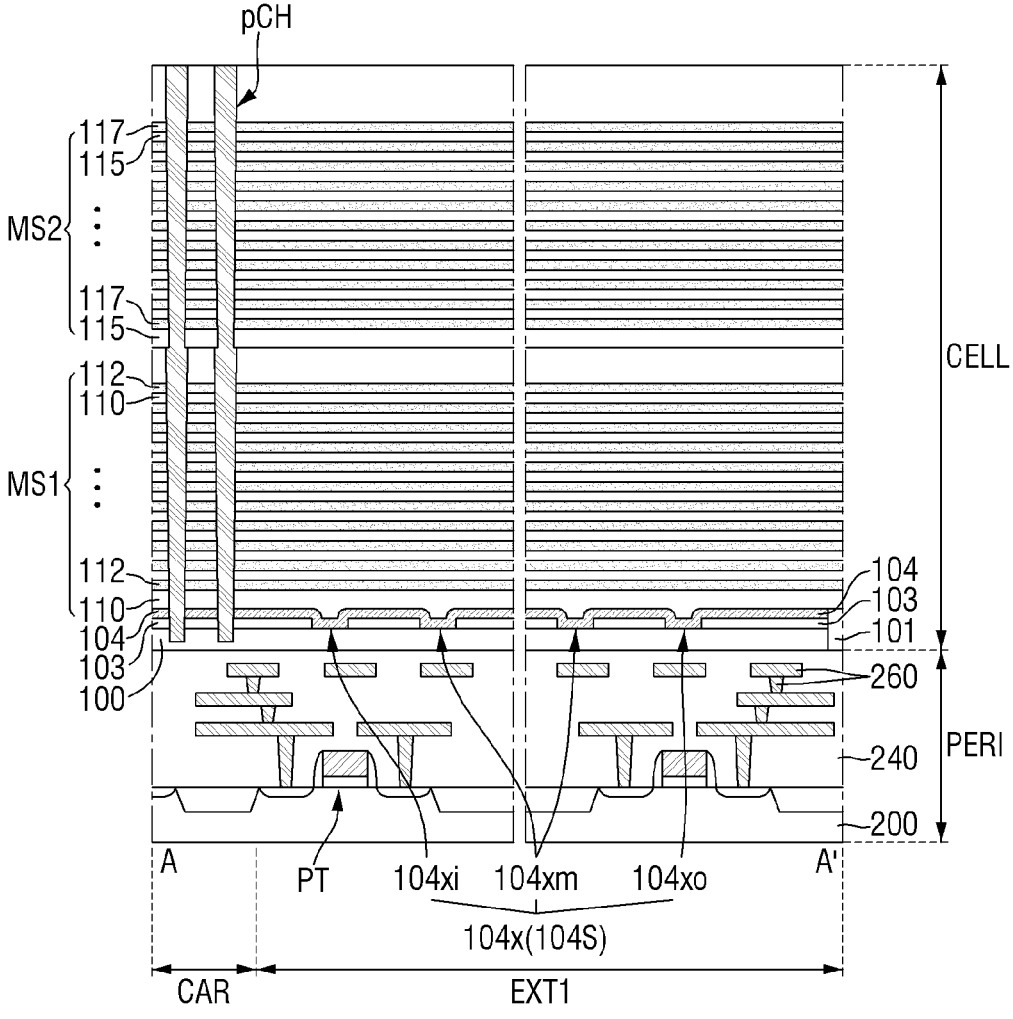

Referring to FIG. 20 and FIG. 21, the mold structure MS1 and MS2 and a plurality of pre-channels pCH are formed on the cell substrate 100 and/or the insulating substrate 101.

The mold structure MS1 and MS2 may be stacked on the support layer 104. The mold structure MS1 and MS2 may include the plurality of mold sacrificial films 112 and 117 and the plurality of mold insulating films 110 and 115 that are alternately stacked on the cell substrate 100 and/or the insulating substrate 101. Each of the mold sacrificial films 112 and 117 may include a material having an etch selectivity with respect to that of each of the mold insulating films 110 and 115. In one example, each of the mold insulating films 110 and 115 may include silicon oxide ($SiO_2$), and each of the mold sacrificial films 112 and 117 may include silicon nitride ($Si_3N_4$).

The plurality of pre-channels pCH may be formed on the cell substrate 100. Each of the pre-channels pCH may extend in the third direction Z and extend through the mold structures MS1 and MS2, the support layer 104 and the source sacrificial layer 103. For example, a bottom of the pre-channel pCH may be disposed in the cell substrate 100 and under the source layer 102.

In an embodiment of the present disclosure, each of the pre-channels pCH may have a stepped portion between the first mold structure MS1 and the second mold structure MS2. For example, after the first mold structure MS1 is formed, a lower portion of the pre-channel pCH extending through the first mold structure MS1 may be formed. Subsequently, after the second mold structure MS2 is formed on the first mold structure MS1, an upper portion of the pre-channel pCH extending through the second mold structure MS2 may be formed. The pre-channel pCH may include, for example, polysilicon (p-Si). However, the present disclosure is not limited thereto.

Although the pre-channels pCH are shown to be formed only on the cell array region CAR of the cell substrate 100, this is only an example. In another example, some of the pre-channels pCH may be formed on the extension region EXT1 and EXT2 of the cell substrate 100. The pre-channels pCH formed on the extension region EXT1 and EXT2 may constitute the dummy channel structures DH as described above with reference to, for example, FIGS. 9 and 10.

Figure 22:
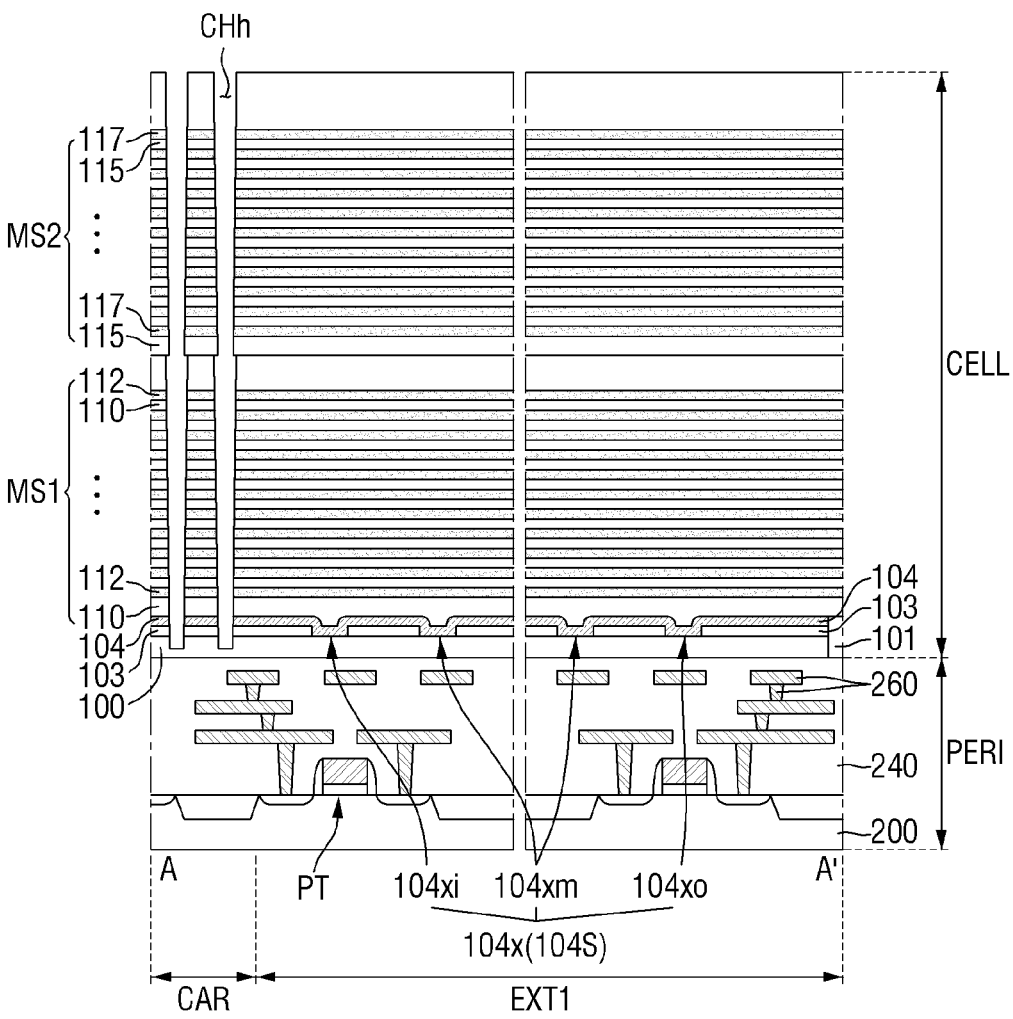

Referring to FIG. 22, the plurality of pre-channels pCH are selectively removed.

As the pre-channels pCH are selectively removed, a plurality of channel holes CHh extending in the third direction Z and extending through the mold structure MS1 and MS2 may be formed.

Figure 23A:
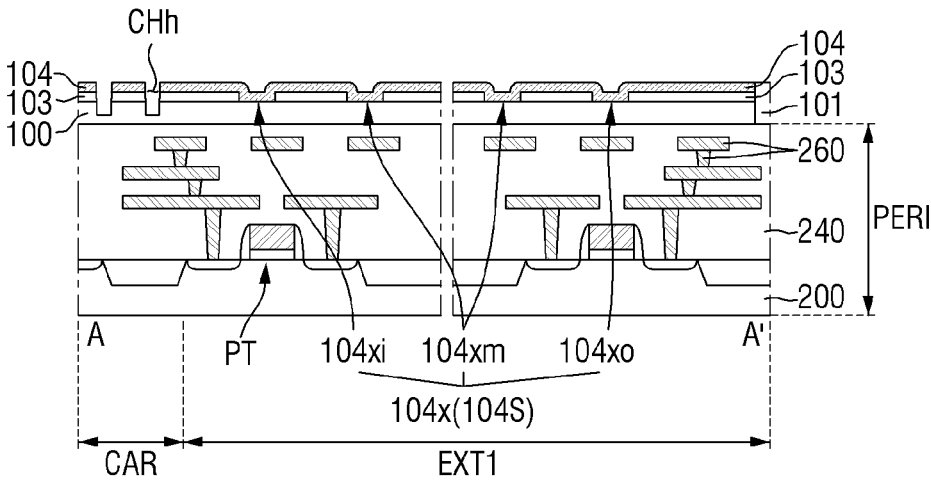

Referring to FIG. 23A, destructive testing is performed on the semiconductor memory device.

The mold structure MS1 and MS2 stacked on the support layer 104 may be removed. The removal of the mold structure MS1 and MS2 may be performed, for example, using a wet etching process. However, the present disclosure is not limited thereto. As the mold structure MS1 and MS2 are removed, it may be checked whether each of the channel holes CHh having a high aspect ratio (AR) is normal.

Figure 23B:
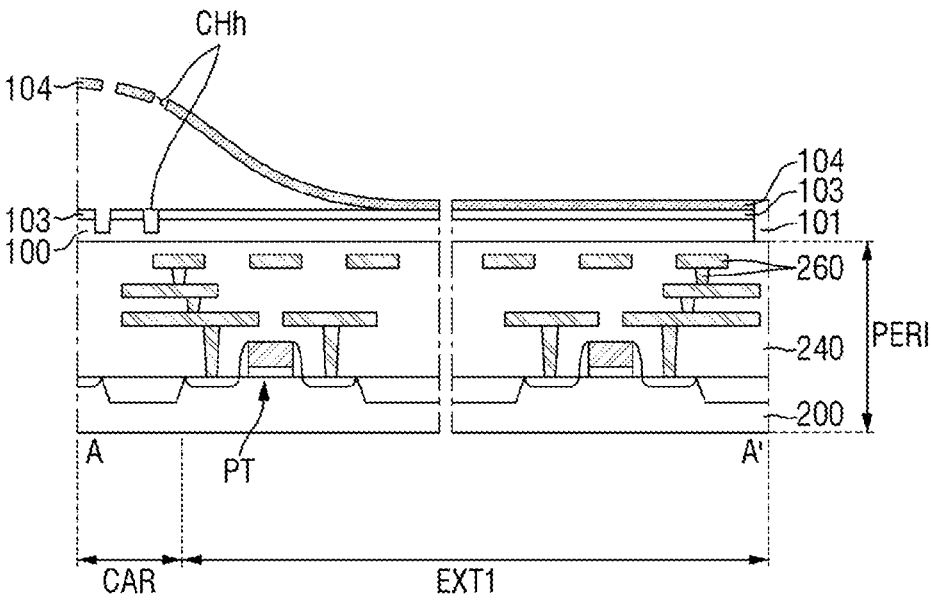

The support layer 104 including the support structure 104S enhances the inspection efficiency of the semiconductor memory device are illustrated with reference to FIGS. 23a and 23b. For example, as shown in FIG. 23B, when the support layer 104 does not include the support structure 104S, the support layer 104 may be lifted off or may be torn off while the mold structure MS1 and MS2 are removed. In this case, each channel hole (CHh) may be checked in a distorted manner due to the support layer 104. Thus, whether the respective channel holes (CHh) are normal may not be identified.

Contrary to that described with reference to FIG. 23b, as shown in FIG. 23A, the support structure 104S of the support layer 104 may firmly fix the support layer 104 in the process of removing the mold structure MS1 and MS2. For example, as described above, the support structure 104S may have the mesh shape and may surround the cell array region CAR in the plan view so that the support layer 104 may be firmly fixed on the cell substrate 100. Accordingly, the semiconductor memory device with enhanced yield and quality may be realized.

Figure 24:
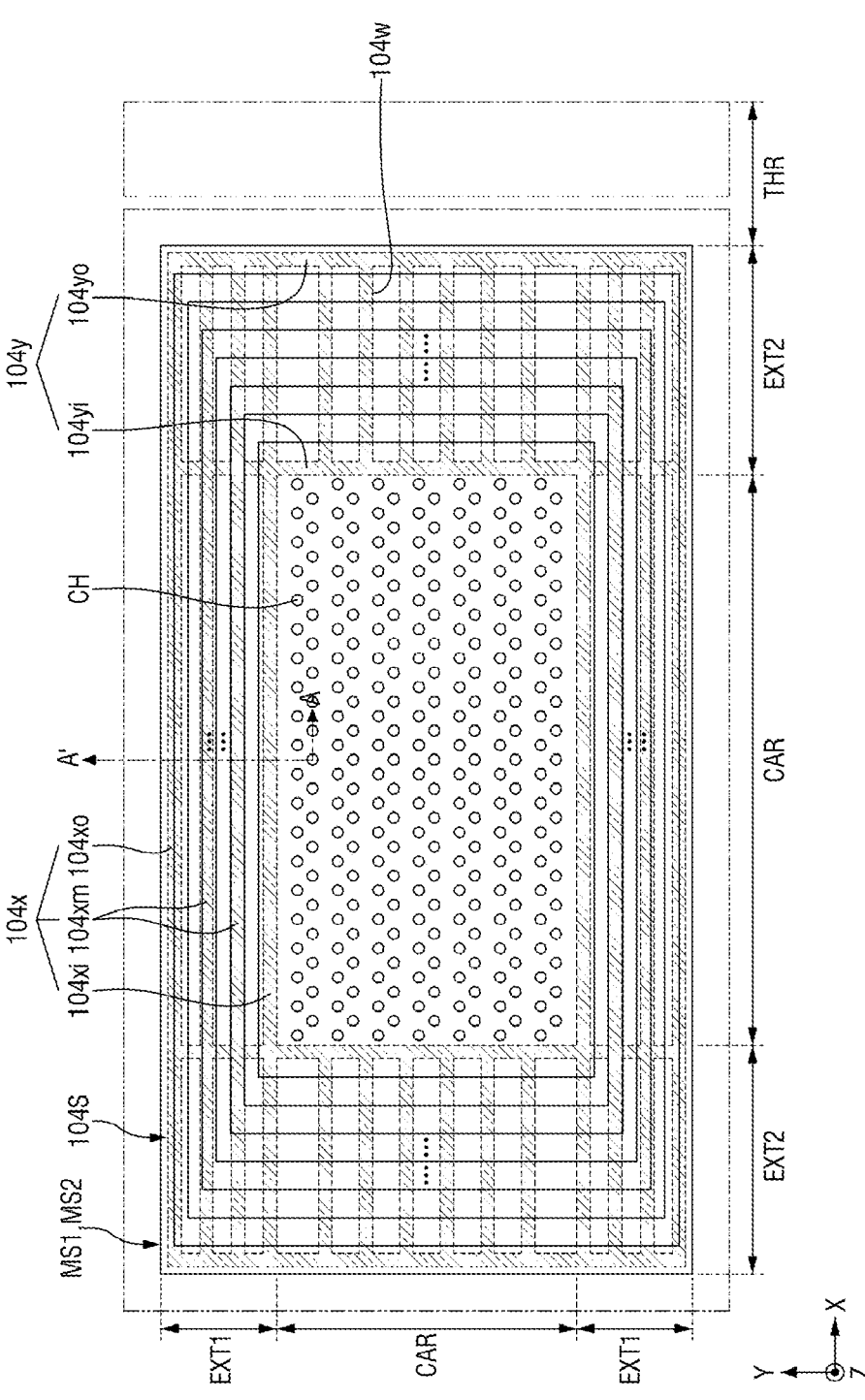
Figure 25:
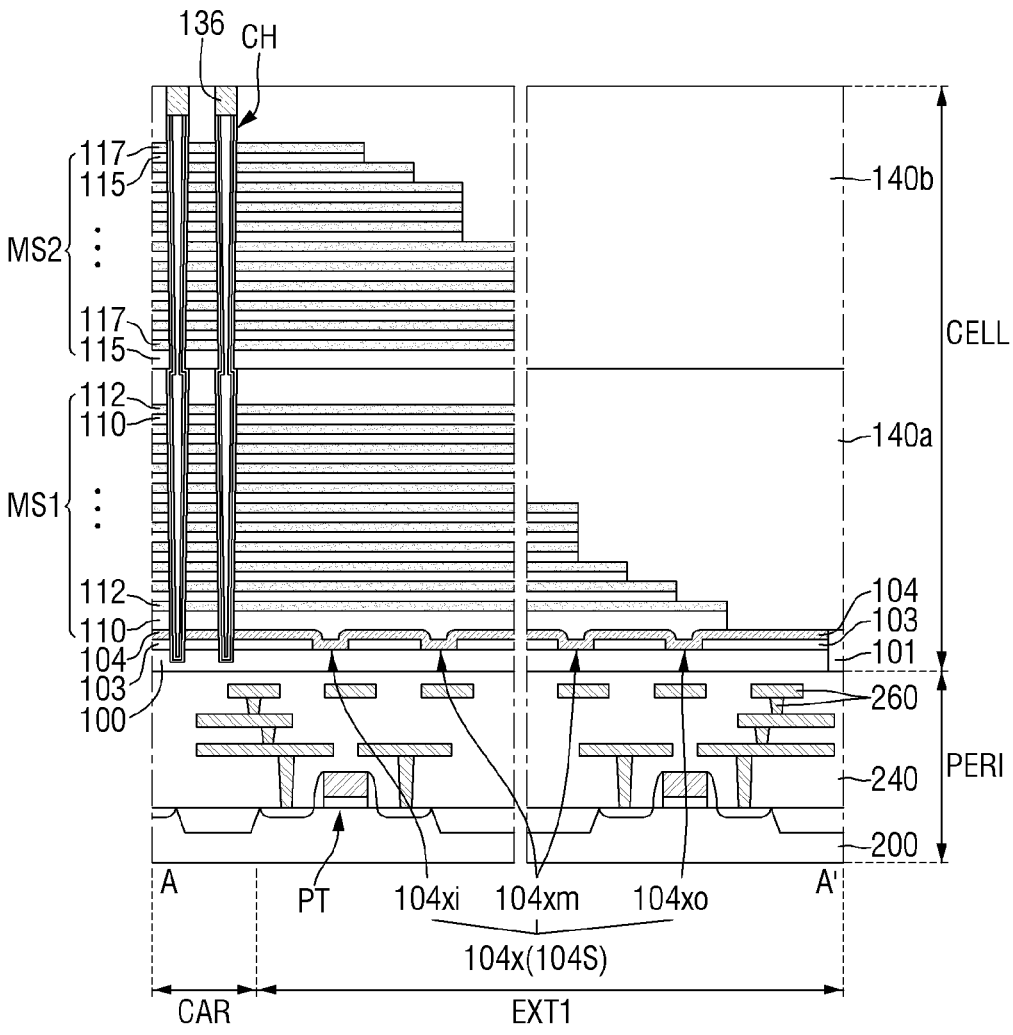

Referring to FIG. 24 and FIG. 25, the plurality of channel structures CH are formed. For reference, FIG. 24 and FIG. 25 are diagrams of intermediate structures to illustrate steps after FIG. 22.

The channel structure CH may fill the channel hole CHh of FIG. 22. Accordingly, the plurality of channel structures CH extending in the third direction Z and extending through the mold structure MS1 and MS2 may be formed.

Further, the mold structure MS1 and MS2 on the extension region EXT1 and EXT2 may be patterned in a stepped manner. The patterning of the mold structure MS1 and MS2 may include forming a mask pattern, which exposes a portion of the mold structure MS1 and MS2 formed on the extension region EXT1 and EXT2, on the mold structure MS1 and MS2, etching the mold insulating films 110 and 115 and the mold sacrificial films 112 and 117 by using the mask pattern as an etch mask, and reducing a width of the mask pattern to increase exposed planar areas of the mold insulating films 110 and 115 and the mold sacrificial films 112 and 117 to be etched. At this time, the etching of the mold insulating films 110 and 115 and the mold sacrificial films 112 and 117 and the reducing of the width of the mask pattern may be alternately repeated. This etching process may be performed on the first mold structure MS1 and the second mold structure MS2 separately. As the mold structure MS1 and MS2 are patterned in the stepped manner, the mold sacrificial films 112 and 117 may be stacked in a stepwise manner on the extension region EXT1 and EXT2.

Figure 26:
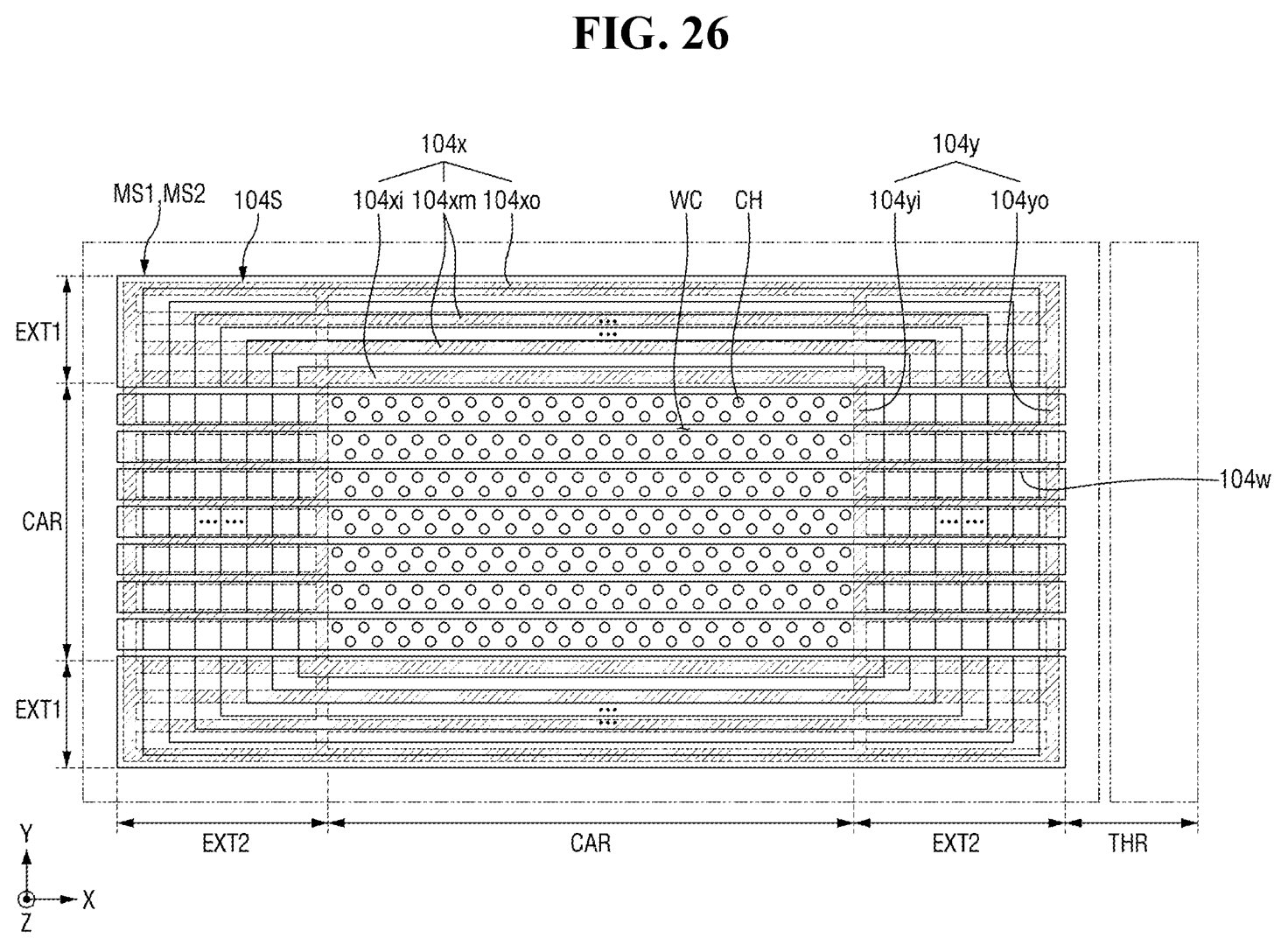
Figure 27:
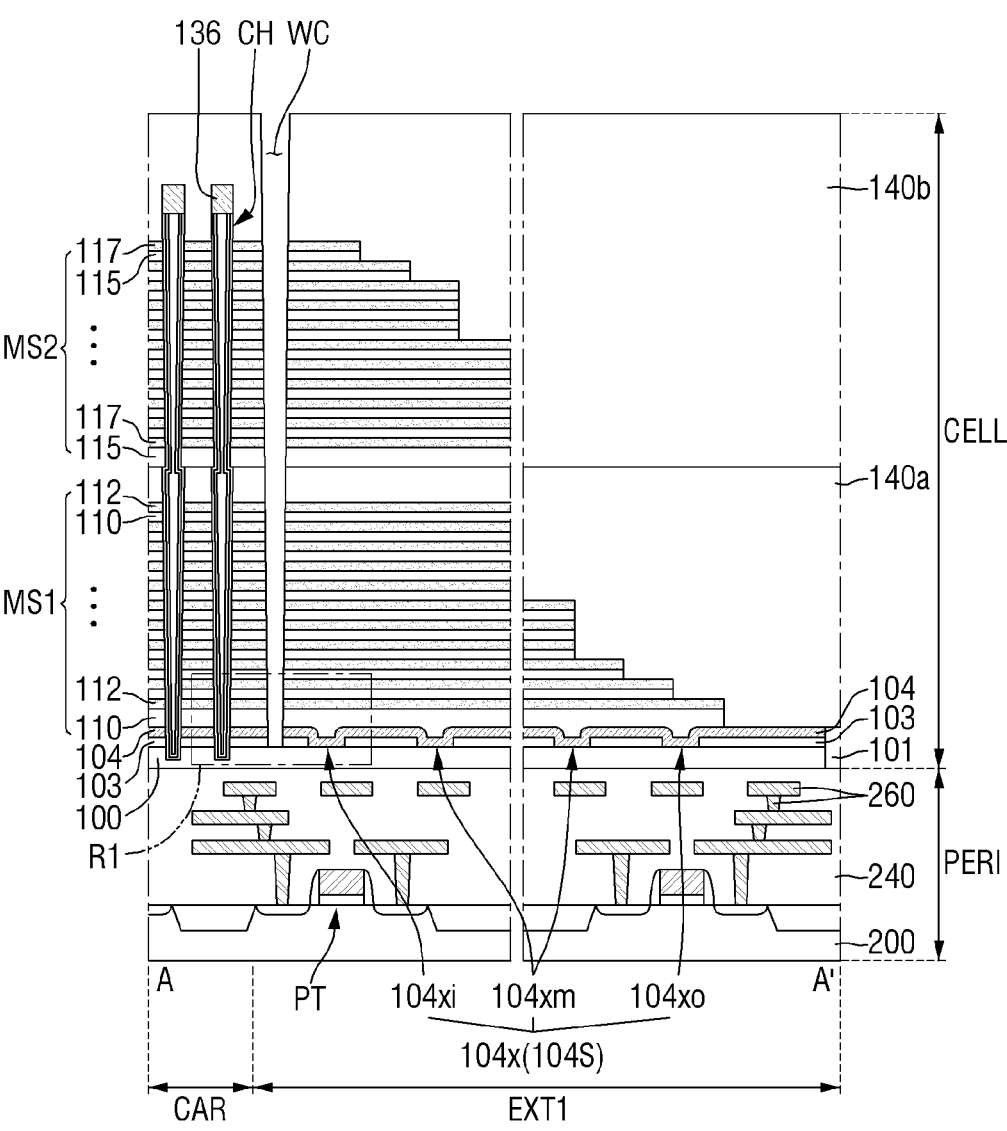
Figure 28:
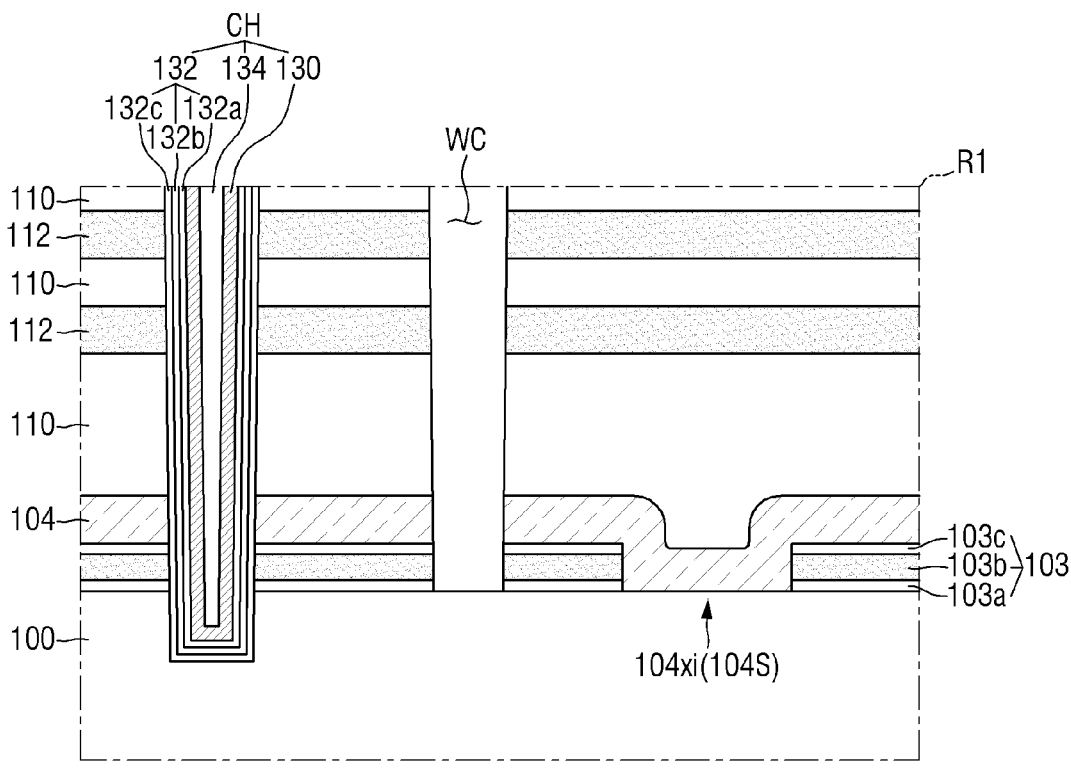

Referring to FIG. 26 to FIG. 28, the block isolation region WC is formed.

The block isolation region WC may extend in the second direction X so as to cut the mold structure MS1 and MS2. Further, the block isolation region WC may cut the source sacrificial layer 103 and the support layer 104.

Figure 29:
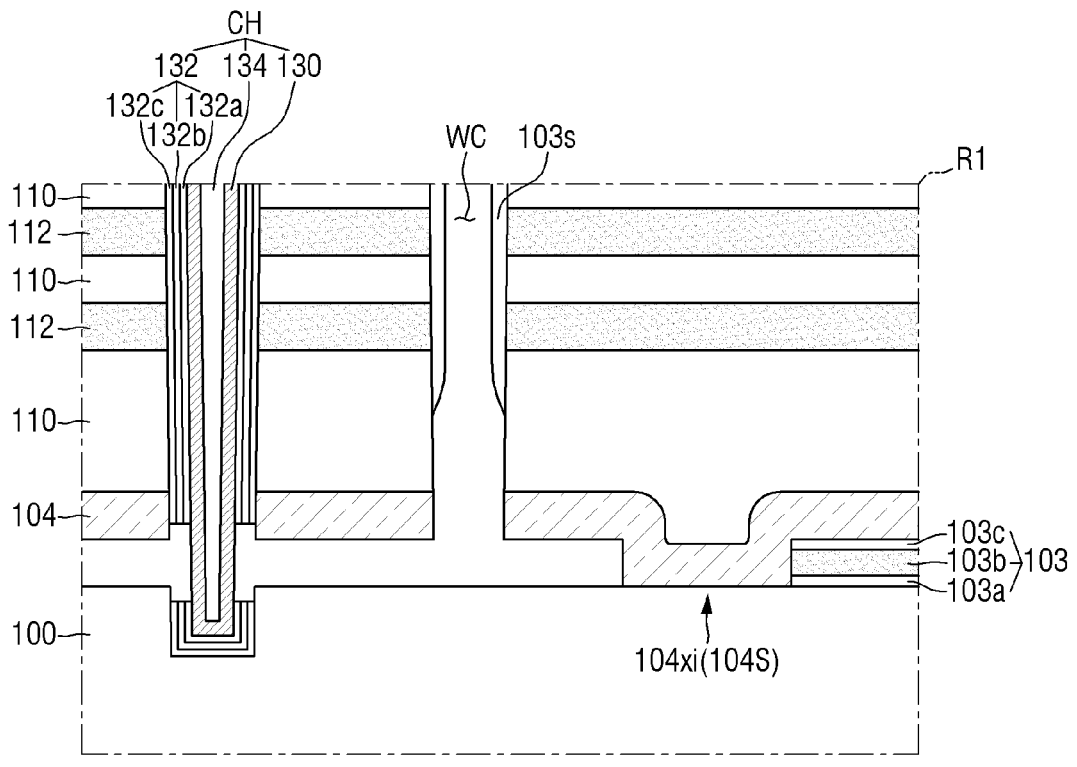

Referring to FIG. 29, a portion of the source sacrificial layer 103 is selectively removed using the block isolation region WC.

A spacer layer 103s extending along and on a portion of an inner surface of the block isolation region WC may be formed. The spacer layer 103s may cover each of the mold sacrificial films 112 and 117 exposed through the block isolation region WC. Further, the spacer layer 103s may not cover the source sacrificial layer 103 exposed through the block isolation region WC. Subsequently, a portion of the source sacrificial layer 103 exposed through the block isolation region WC may be removed.

Further, after the portion of the source sacrificial layer 103 is removed, a portion of a side surface of the semiconductor pattern 130 of each of the channel structures CH may be exposed. For example, as shown, a portion of the information storage film 132 exposed as the portion of the source sacrificial layer 103 is removed may be removed. In addition, besides the portion of the information storage film 132 adjacent to the source sacrificial layer 103, a portion thereof upward between the semiconductor pattern 130 and the support layer 104, and a portion thereof downward between the semiconductor pattern 130 and the cell substrate 100 may also be removed.

The support layer 104 may function as an etch stop layer such that during the process of removing the portion of the source sacrificial layer 103, the other portion of the source sacrificial layer 103 is not removed (e.g., a portion of the source sacrificial layer 103 on the extension region EXT1 and EXT2 is not removed). For example, as described above with reference to FIGS. 3 to 8, at least a portion of the support structure 104S may surround the cell array region CAR in the plan view. Accordingly, the support structure 104S may protect the source sacrificial layer 103 on the extension region EXT1 and EXT2 from the block isolation region WC. For example, the etchant from the block isolation region WC may remove a portion of the source sacrificial layer 103 exposed by the block isolation region WC, while the source sacrificial layer 103 on the extension region EXT1 and EXT2 may be protected by the support structure 104S and prevented from being etched by the etchant from the block isolation region WC. In one example, the first inner extension 104xi may protect the source sacrificial layer 103 on the first region EXT1 from the block isolation region WC, while the second inner extension 104yi and the first block isolation region-inserted portion 104w may protect the source sacrificial layer 103 on the second region EXT2 from the block isolation region WC.

Figure 30:
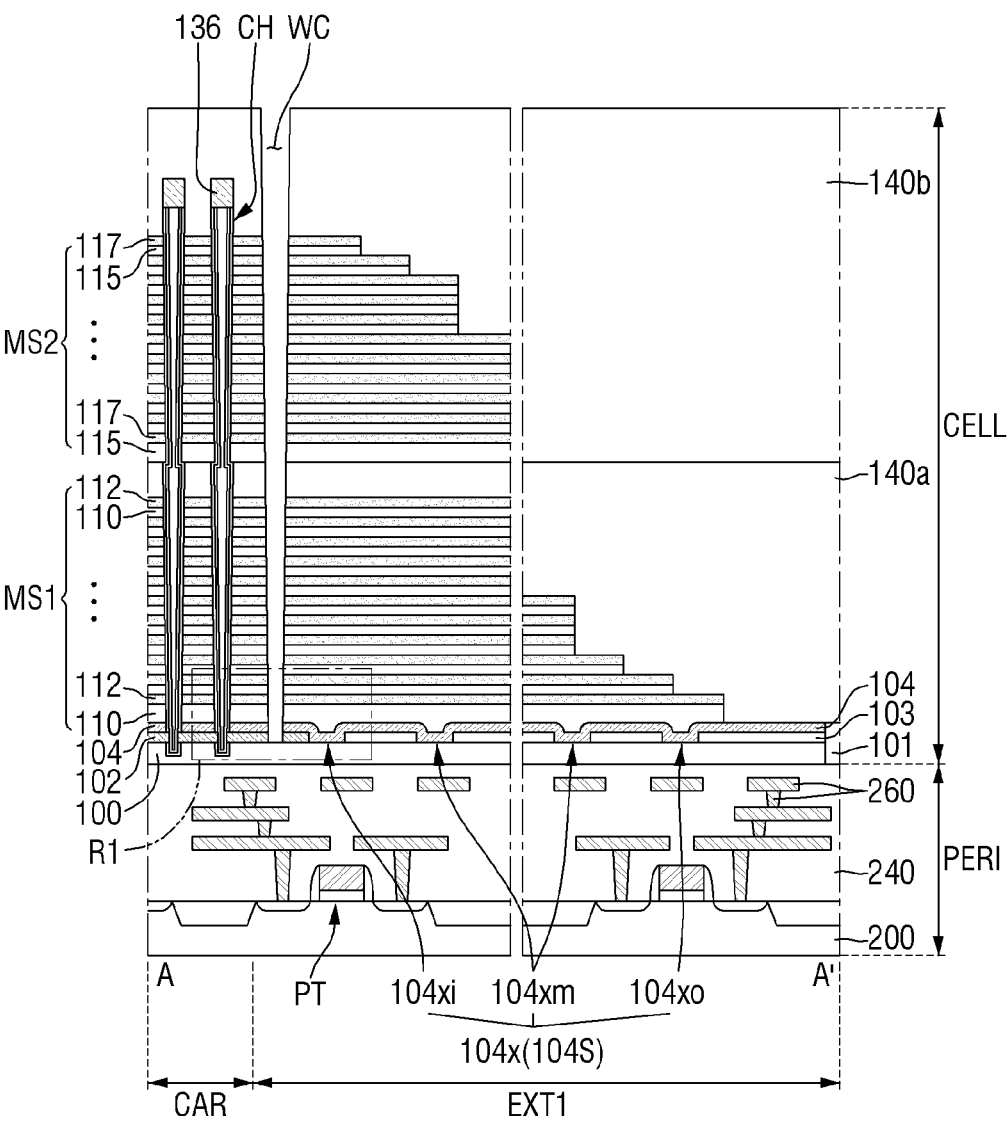
Figure 31:
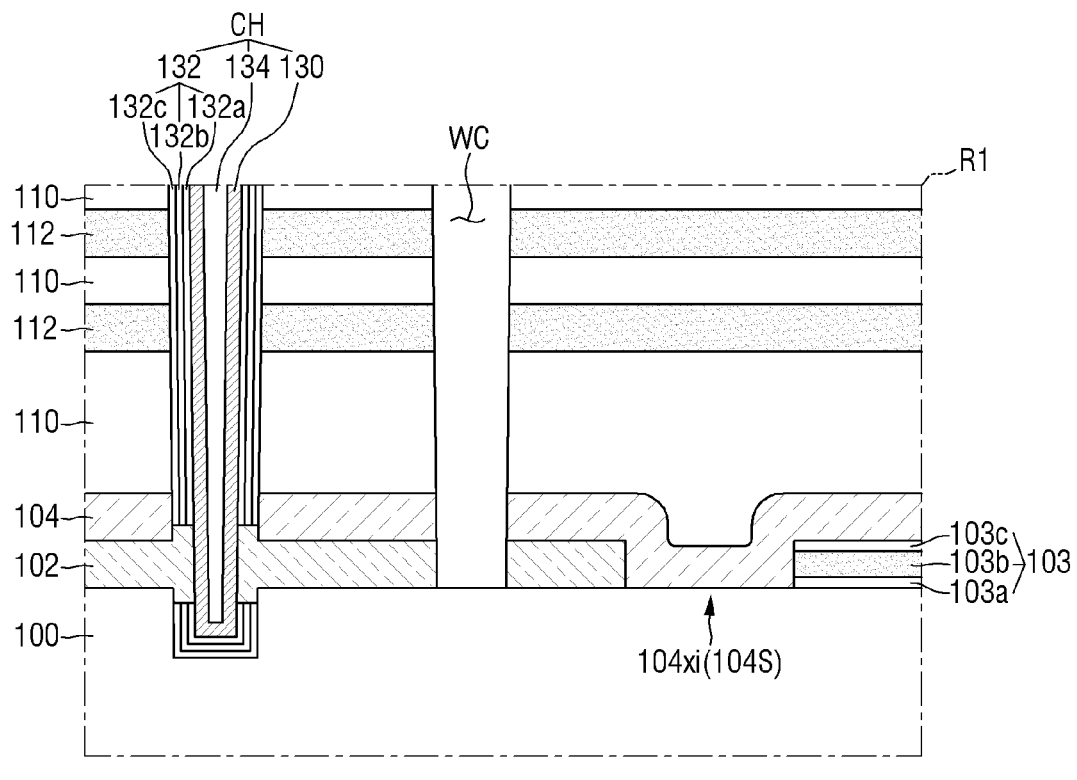

Referring to FIG. 30 and FIG. 31, the source layer 102 is formed.

For example, the source layer 102 may be formed so as to fill the removed portion of the source sacrificial layer 103. Accordingly, the source layer 102 may be connected to the semiconductor pattern 130 of each of the channel structures CH. The source layer 102 may include a conductive material, for example, a metal or polysilicon (p-Si) doped with impurities. However, the present disclosure is not limited thereto. After the formation of source layer 102, the source layer 102 and the source sacrificial layer 103 may be separated by the first inner extension 104xi in the first region EXT1, and the source layer 102 and the source sacrificial layer 103 may be separated by the second inner extension 104yi in the second region EXT2. In an embodiment of the present disclosure, at least a portion of the support structure 104S (e.g., the first inner extension 104xi and the second inner extension 104yi) may be interposed between the source layer 102 and the source sacrificial layer 103.

Figure 32:
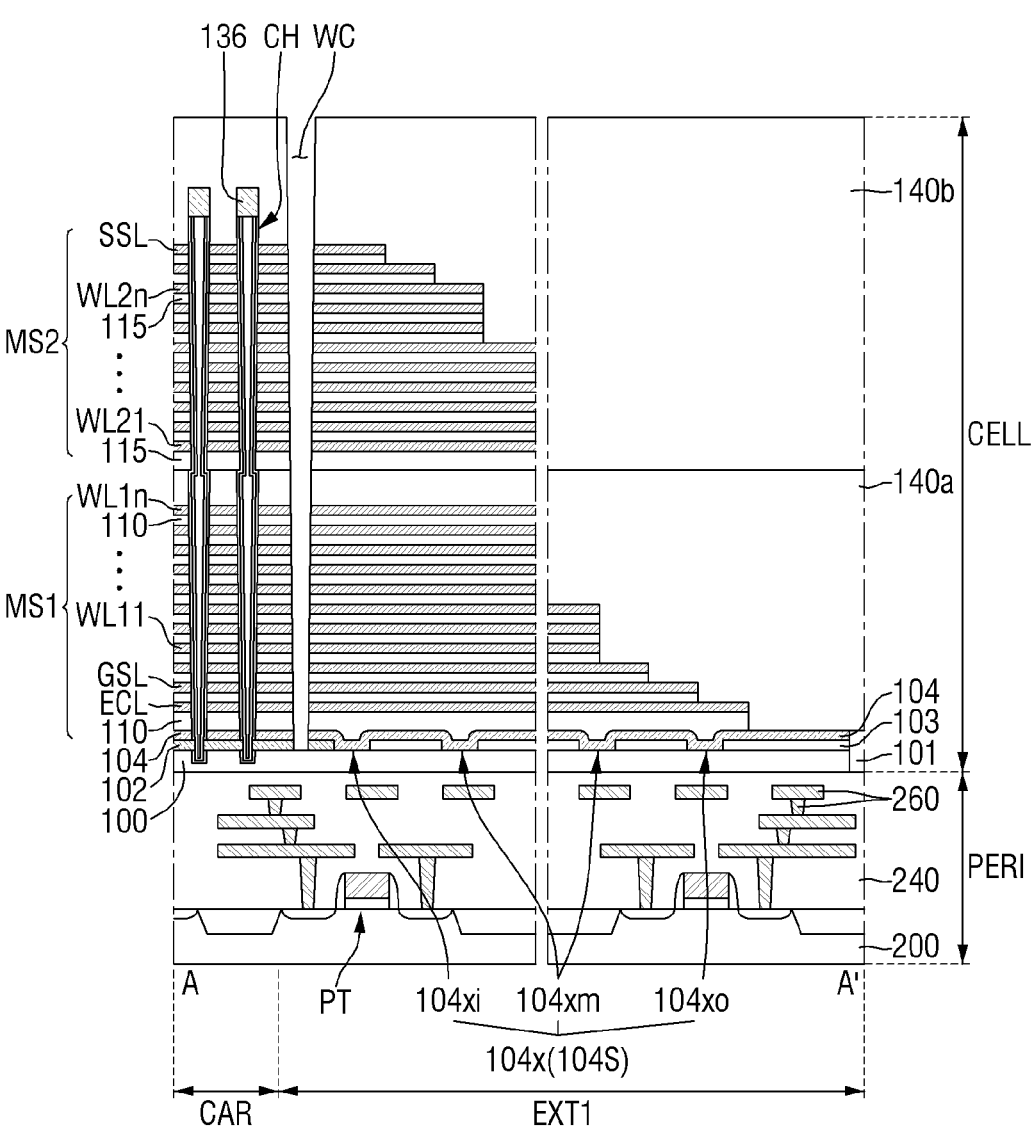

Referring to FIG. 32, the plurality of gate electrodes ECL, GSL, WL11 to WL1n, WL21 to WL2n, and SSL are formed.

The mold sacrificial films 112 and 117 exposed through the block isolation region WC may be selectively removed. Since each of the mold sacrificial films 112 and 117 has the etch selectivity with respect to that of each of the mold insulating films 110 and 115, each of the mold sacrificial films 112 and 117 may be selectively removed. Subsequently, the gate electrodes ECL, GSL, WL11 to WL1n, WL21 to WL2n, and SSL may be formed so as to fill the removed portion of each of the mold sacrificial films 112 and 117. Each of the gate electrodes ECL, GSL, WL11 to WL1n, WL21 to WL2n, and SSL may be made of a conductive material including a metal such as, for example, tungsten (W), cobalt (Co), copper (Cu), aluminum (Al), titanium (Ti), tantalum (Ta), or nickel (Ni) or a semiconductor material such as silicon (Si). However, the present disclosure is not limited thereto. For example, each of the gate electrodes ECL, GSL, WL11 to WL1n, WL21 to WL2n, and SSL may include a metal nitride (e.g., titanium nitride (TiN) or tantalum nitride (TaN)), a metal silicide (e.g., titanium silicide ($TiSi_2$), tungsten silicide ($WSi_2$), cobalt silicide ($CoSi_2$) or nickel silicide ($NiSi_2$)), or any combination thereof.

Subsequently, referring to FIGS. 3 to 8, the cell contact 162, the substrate contact 164, the through-via 166 and the first line structure 180 are formed. Thus, the semiconductor memory device as described above with reference to FIGS. 3 to 8 may be manufactured.

Hereinafter, an electronic system including a semiconductor memory device according to an embodiment of the present disclosure will be described with reference to FIGS. 1 to 16 and FIG. 33 to FIG. 35.

Figure 33:
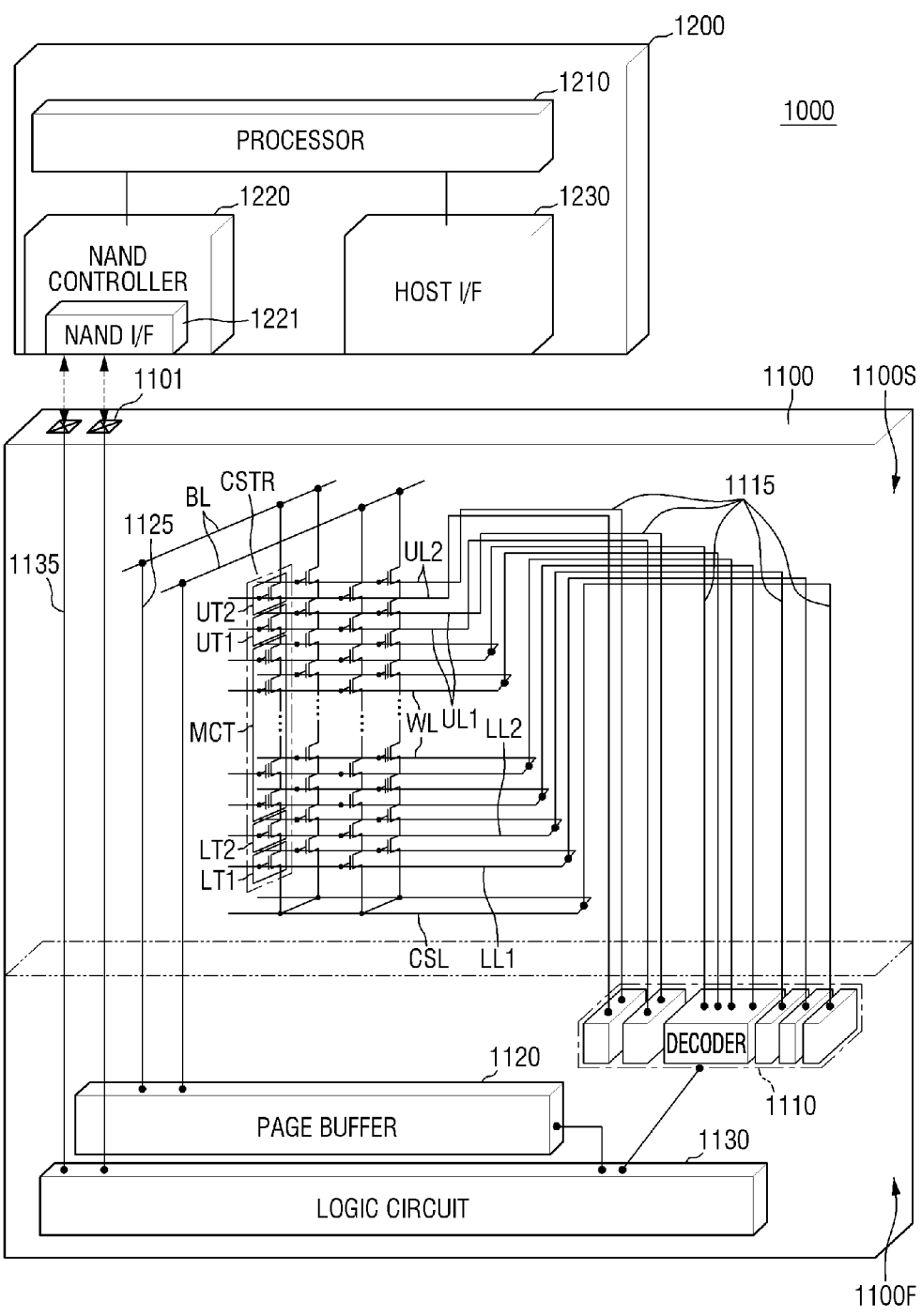
FIG. 33 is an exemplary block diagram for illustrating an electronic system according to an embodiment of the present disclosure.
Figure 34:
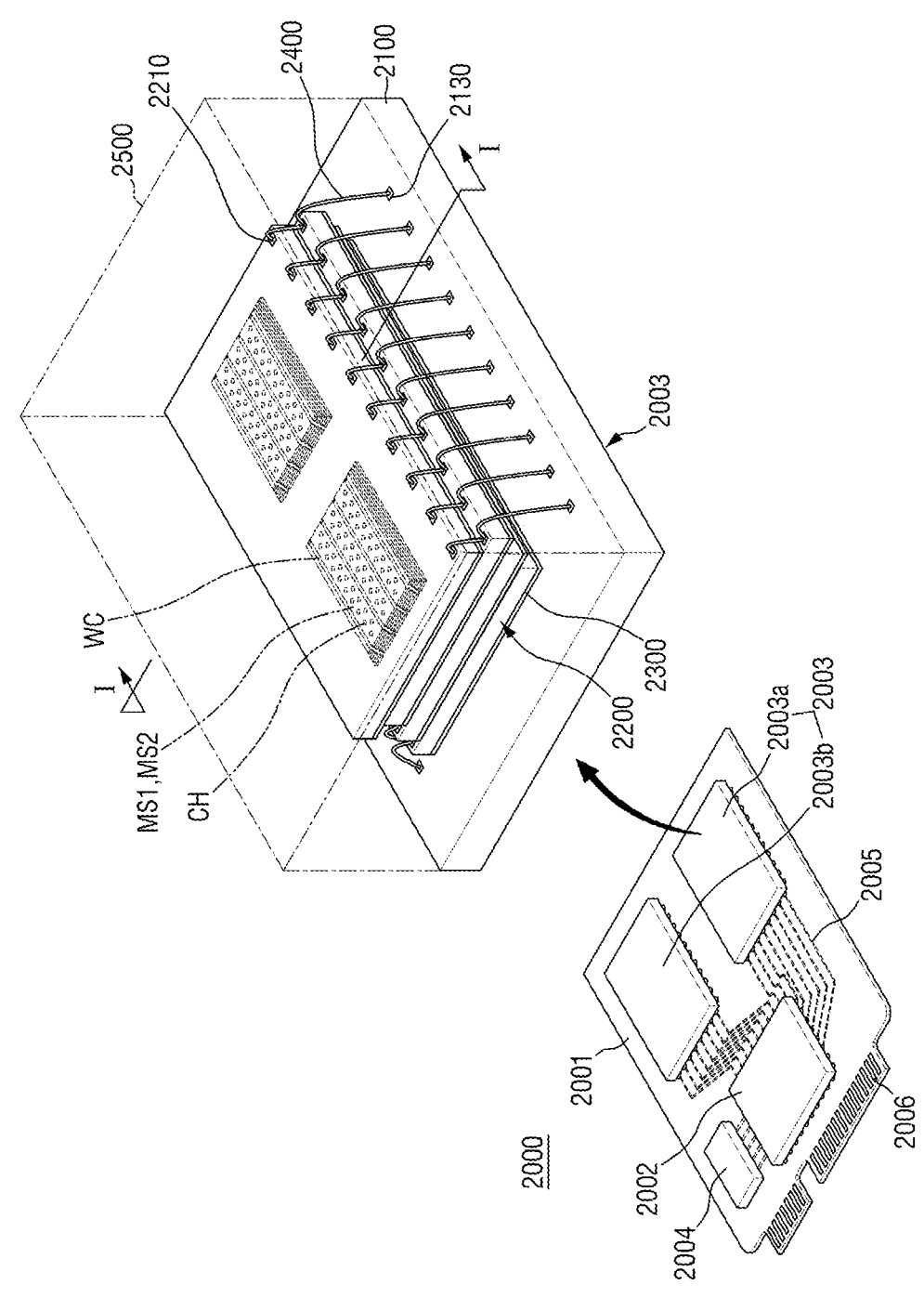
FIG. 34 is an exemplary perspective view for illustrating an electronic system according to an embodiment of the present disclosure.
Figure 35:
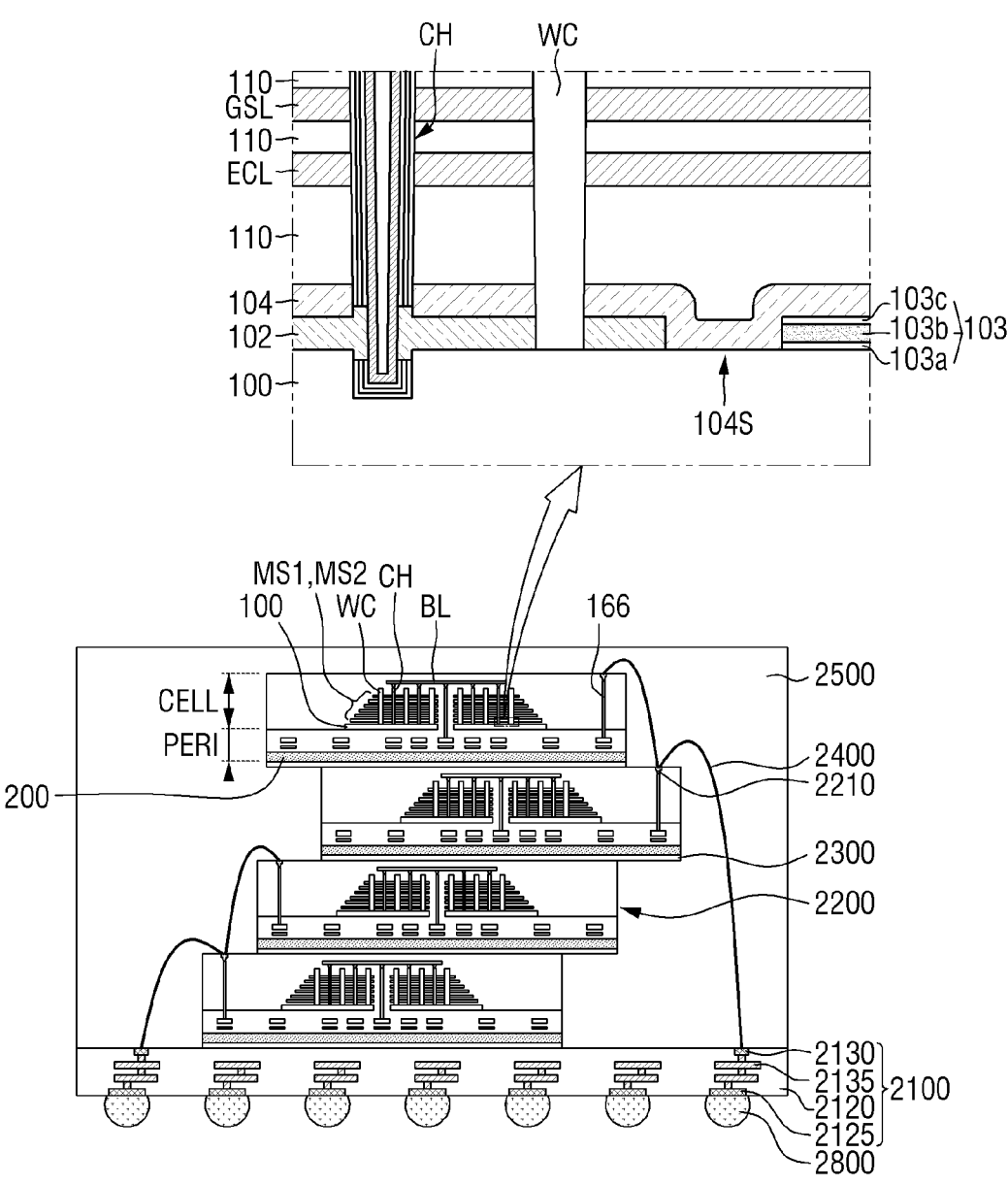
FIG. 35 is a schematic cross-sectional view taken along I-I of FIG. 34.

FIG. 33 is an exemplary block diagram for illustrating an electronic system according to an embodiment of the present disclosure. FIG. 34 is an exemplary perspective view for illustrating an electronic system according to an embodiment of the present disclosure. FIG. 35 is a schematic cross-sectional view taken along I-I of FIG. 34. For convenience of illustration, parts duplicate with those as described above with reference to FIGS. 1 to 32 are briefly described or omitted.

Referring to FIG. 33, an electronic system 1000 according to an embodiment of the present disclosure may include a semiconductor memory device 1100 and a controller 1200 electrically connected to the semiconductor memory device

1100. The electronic system 1000 may be embodied as a storage device including one or a plurality of semiconductor memory devices 1100 or an electronic device including the storage device. For example, the electronic system 1000 may be embodied as, for example, a solid state drive device (SSD), a universal serial bus (USB), a computing system, a medical device, or a communication device including one or a plurality of semiconductor memory devices 1100.

The semiconductor memory device 1100 may be embodied as a semiconductor memory device (e.g., a NAND flash memory device) and may include, for example, the semiconductor memory device as described above with reference to FIGS. 1 to 16. The semiconductor memory device 1100 may include a first structure 1100F and a second structure 1100S on the first structure 1100F. In FIG. 33, the first structure 1100F is illustrated to be under the second structure 1100S, however, the present disclosure is not limited thereto. For example, the first structure 1100F may be beside and/or on the second structure 1100S.

The first structure 1100F may be a peripheral circuit structure including a decoder circuit 1110 (for example, the row decoder 33 in FIG. 1), the page buffer 1120 (for example, the page buffer 35 in FIG. 1), and a logic circuit 1130 (for example, the control logic 37 of FIG. 1).

The second structure 1100S may include the common source line CSL, the plurality of bit-lines BL, and the plurality of cell strings CSTR as described above with reference to FIG. 2. The cell strings CSTR may be connected to the decoder circuit 1110 via the word-line WL, at least one string select line SSL, and at least one ground select line GSL. Further, the cell strings CSTR may be connected to the page buffer 1120 via the bit-lines BL.

The second structure 1100S may be a memory cell structure including a bit-line BL, a common source line CSL, word lines WL, first and second upper gate lines UL1 and UL2, first and second lower gate lines LL1 and LL2, and memory cell strings CSTR disposed between the bit-line BL and the common source line CSL. In the second structure 1100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with an embodiment of the present disclosure. In an embodiment of the present disclosure, the upper transistors UT1 and UT2 may include string select transistors SST, and the lower transistors LT1 and LT2 may include ground select transistors GST and erase control transistors ECT.

In an embodiment of the present disclosure, the common source line CSL and the cell strings CSTR may be electrically connected to the decoder circuit 1110 via first connection lines 1115 extending from the first structure 1100F to the second structure 1100S. The first connection line 1115 may correspond to the through-via 166 as described above with reference to FIGS. 1 to 15. That is, the through-via 166 may electrically connect each of the gate electrodes ECL, GSL, WL, and SSL and the decoder circuit 1110 (e.g., the row decoder 33 of FIG. 1).

In an embodiment of the present disclosure, the bit-lines BL may be electrically connected to the page buffer 1120 via second connection lines 1125 extending from the first structure 1100F to the second structure 1100S. The second connection line 1125 may correspond to the through-via 166 as described above with reference to FIGS. 1 to 12. That is, the through-via 166 may electrically connect the bit-lines BL and the page buffer 1120 (e.g., the page buffer 35 of FIG. 1) to each other.

The semiconductor memory device 1100 may communicate with the controller 1200 via an input/output pad 1101 electrically connected to the logic circuit 1130 (e.g., the control logic 37 in FIG. 1). The input/output pad 1101 may be electrically connected to the logic circuit 1130 via an input/output connection line 1135 extending from the first structure 1100F to the second structure 1100S.

The controller 1200 may include a processor 1210, a NAND controller 1220, and a host interface (HOST I/F) 1230. In an embodiment of the present disclosure, the electronic system 1000 may include a plurality of semiconductor memory devices 1100. In this case, the controller 1200 may control the plurality of semiconductor memory devices 1100.

The processor 1210 may control overall operations of the electronic system 1000 including the controller 1200. The processor 1210 may operate based on predefined firmware, and may control the NAND controller 1220 to access the semiconductor memory device 1100. The NAND controller 1220 may include a NAND interface (NAND I/F) 1221 that processes communication with the semiconductor memory device 1100. Via the NAND interface (NAND I/F) 1221, a control command for controlling the semiconductor memory device 1100, data to be written to memory cell transistors MCT of the semiconductor memory device 1100, and data to be read from the memory cell transistors MCT of the semiconductor memory device 1100 may be transmitted. The host interface (HOST I/F) 1230 may provide a communication function between the electronic system 1000 and an external host. Upon receiving a control command from an external host via the host interface (HOST I/F) 1230, the processor 1210 may control the semiconductor memory device 1100 in response to the control command.

Referring to FIG. 34 and FIG. 35, an electronic system 2000 according to an embodiment of the present disclosure may include a main substrate 2001, a main controller 2002 mounted on the main substrate 2001, at least one semiconductor package 2003 and at least one DRAM 2004. The semiconductor package 2003 and the DRAM 2004 may be connected to the main controller 2002 via line patterns 2005 formed on the main substrate 2001.

The main substrate 2001 may include a connector 2006 including a plurality of pins coupled to an external host. The number and an arrangement of the plurality of pins in the connector 2006 may vary based on a communication interface between the electronic system 2000 and the external host. In an embodiment of the present disclosure, the electronic system 2000 may communicate with the external host using one of interfaces such as, for example, universal serial bus (USB), peripheral component interconnect express (PCI-Express), serial advanced technology attachment (SATA), M-Phy for universal flash storage (UFS), etc. In an embodiment of the present disclosure, the electronic system 2000 may operate using power supplied from the external host via the connector 2006. The electronic system 2000 may further include a power management integrated circuit (PMIC) for distributing power supplied from the external host to the main controller 2002 and the semiconductor package 2003.

The main controller 2002 may write data to the semiconductor package 2003 or read data from the semiconductor package 2003, and may enhance an operating speed of the electronic system 2000.

The DRAM 2004 may act as a buffer memory for reducing a difference between operation speeds of the semiconductor package 2003 as a data storage space and the external host. The DRAM 2004 included in electronic system 2000 may operate as a cache memory, and may provide a space for temporarily storing data therein in a control operation of the semiconductor package 2003. When the DRAM 2004 is included in the electronic system 2000, the main controller 2002 may further include a DRAM controller for controlling the DRAM 2004 in addition to a NAND controller for controlling the semiconductor package 2003.

The semiconductor package 2003 may include a first semiconductor package 2003a and a second semiconductor package 2003b spaced apart from each other. Each of the first semiconductor package 2003a and the second semiconductor package 2003b may be embodied as a semiconductor package including a plurality of semiconductor chips 2200. Each of the first semiconductor package 2003a and the second semiconductor package 2003b may include a package substrate 2100, semiconductor chips 2200 on the package substrate 2100, adhesive layers 2300 disposed on a bottom surface of each of the semiconductor chips 2200, a connection structure 2400 electrically connecting the semiconductor chips 2200 and the package substrate 2100 to each other, and a molding layer 2500 disposed on the package substrate 2100 and covering the semiconductor chips 2200 and the connection structure 2400. Though only the first and second semiconductor packages 2003a and 2003b are illustrated, the number of the semiconductor packages is not so limited, and the electronic system 2000 may include more or fewer semiconductor packages.

The package substrate 2100 may be embodied as a printed circuit board including package upper pads 2130. Each semiconductor chip 2200 may include an input/output pad 2210. The input/output pad 2210 may correspond to the input/output pad 1101 of FIG. 33.

In an embodiment of the present disclosure, the connection structure 2400 may be embodied as a bonding wire that electrically connects the input/output pad 2210 and the package upper pads 2130 to each other. Accordingly, in each of the first semiconductor package 2003a and the second semiconductor package 2003b, the semiconductor chips 2200 may be electrically connected to each other in a bonding wire scheme, and may be electrically connected to the package upper pads 2130 of the package substrate 2100. In an embodiment of the present disclosure, in each of the first semiconductor package 2003a and the second semiconductor package 2003b, the semiconductor chips 2200 may be electrically connected to each other via a connection structure including a through electrode (Through Silicon Via: TSV) instead of the connection structure 2400 using the bonding wire scheme.

In an embodiment of the present disclosure, the main controller 2002 and the semiconductor chips 2200 may be included in one package. In an embodiment of the present disclosure, the main controller 2002 and the semiconductor chips 2200 may be mounted on a separate interposer substrate different from the main substrate 2001, and the main controller 2002 and the semiconductor chips 2200 may be connected to each other via a line formed in the interposer substrate.

In an embodiment of the present disclosure, the package substrate 2100 may be embodied as a printed circuit board. The package substrate 2100 may include a package substrate body 2120, the package upper pads 2130 disposed on an upper surface of the package substrate body 2120, package lower pads 2125 disposed on a bottom surface of the package substrate body 2120, or exposed through the bottom surface thereof, and internal lines 2135 disposed in the package substrate body 2120 so as to electrically connect the package upper pads 2130 and the package lower pads 2125 to each other. The package upper pads 2130 may be electrically connected to the connection structures 2400. The package lower pads 2125 may be connected to the line patterns 2005 of the main substrate 2001 of the electronic system 2000 as shown in FIG. 34 via conductive connections 2800.

In the electronic system according to an embodiment of the present disclosure, each of the semiconductor chips 2200 may include the semiconductor memory device as described above with reference to FIGS. 1 to 15. For example, each of the semiconductor chips 2200 may include the peripheral circuit region PERI and the memory cell region CELL stacked on the peripheral circuit region PERI. By way of example, the peripheral circuit region PERI may include the peripheral circuit substrate 200 as described above with reference to FIGS. 3 to 8. Further, by way of example, the memory cell region CELL may include the cell substrate 100, the mold structure MS1 and MS2, the plurality of channel structures CH, the source layer 102, the source sacrificial layer 103, the support layer 104, the block isolation region WC, and the bit-line BL as described above with reference to FIGS. 3 to 8.

In concluding the detailed description, those skilled in the art will appreciate that many variations and modifications may be made to the specific embodiments disclosed without substantially departing from the spirit and scope of the present disclosure as defined in the appended claims. Therefore, the disclosed specific embodiments of the present disclosure are used in a generic and descriptive sense only and not for purposes of limitation.

What is claimed is:

1. A semiconductor memory device comprising:
   a cell substrate including a cell array region and an extension region surrounding the cell array region;
   a mold structure including a plurality of gate electrodes sequentially stacked on the cell substrate, wherein the plurality of gate electrodes are stacked in a stepwise manner on the extension region;
   a plurality of channel structures disposed on the cell array region and extending in a vertical direction intersecting an upper surface of the cell substrate, wherein each of the plurality of channel structures intersects the plurality of gate electrodes;
   a bit-line extending in a first direction intersecting the vertical direction, wherein the bit-line is connected to at least some of the plurality of channel structures;
   a block isolation region extending in a second direction intersecting the vertical direction and the first direction, wherein the block isolation region cuts the mold structure;
   a source layer disposed between the cell substrate and the mold structure, and connected to a side surface of each of the plurality of channel structures; and
   a support layer disposed between the source layer and the mold structure, wherein the support layer extends along and on the upper surface of the cell substrate and an upper surface of the source layer,
   wherein the support layer includes a support structure in contact with the upper surface of the cell substrate, and the support structure includes:
      a peripheral portion continuously extending so as to surround the cell array region in a plan view of the device; and a mesh portion disposed on the extension region and having a mesh shape in the plan view of the device.

2. The semiconductor memory device of claim 1, wherein each of the plurality of channel structures includes:
   a semiconductor pattern extending in the vertical direction and extending through the mold structure; and
   an information storage film interposed between the semiconductor pattern and each of the plurality of gate electrodes,
   wherein the source layer extends through the information storage film and is connected to a side surface of the semiconductor pattern.

3. The semiconductor memory device of claim 2, wherein the information storage film includes a tunnel insulating film, a charge storage film, and a blocking insulating film sequentially stacked on the side surface of the semiconductor pattern.

4. The semiconductor memory device of claim 1, further comprising:
   a source sacrificial layer between the cell substrate and the support layer,
   wherein the source sacrificial layer is disposed at a level the same as a level at which the source layer is disposed, and
   the source layer and the source sacrificial layer include different materials.

5. The semiconductor memory device of claim 4, wherein at least a portion of the support structure is interposed between the source layer and the source sacrificial layer.

6. The semiconductor memory device of claim 4, wherein the source layer is disposed on the cell array region, and
   the source sacrificial layer is disposed on the extension region.

7. The semiconductor memory device of claim 1, wherein the extension region includes first and second regions,
   the first region and the cell array region are arranged along the first direction, while the cell array region and the second region are arranged along the second direction,
   the support structure includes:
      a plurality of first extensions disposed on the first region, arranged side by side and extending in the second direction; and
      a plurality of second extensions disposed on the second region, arranged side by side, and extending in the first direction, and
   the plurality of first extensions and the plurality of second extensions intersect each other to form the mesh portion.

8. The semiconductor memory device of claim 7, wherein the plurality of first extensions include a first inner extension adjacent to the cell array region,
   the plurality of second extensions include a second inner extension adjacent to the cell array region, and
   the first inner extension and the second inner extension constitute the peripheral portion.

9. The semiconductor memory device of claim 1, further comprising:
   a peripheral circuit substrate;
   a peripheral circuit element disposed on the peripheral circuit substrate;
   an interline insulating film covering the peripheral circuit element; and
   a line structure formed in the interline insulating film,
   wherein the cell substrate is stacked on the interline insulating film.

10. The semiconductor memory device of claim 9, wherein the mold structure and the peripheral circuit element are interposed between the cell substrate and the peripheral circuit substrate.

11. A semiconductor memory device comprising:

a cell substrate including a cell array region and a first region, wherein the cell array region and the first region are arranged along a first direction;

a mold structure including a plurality of gate electrodes sequentially stacked on the cell substrate, wherein the plurality of gate electrodes are stacked in a stepwise manner along the first direction on the first region;

a plurality of channel structures disposed on the cell array region and extending in a vertical direction intersecting an upper surface of the cell substrate, wherein each of the plurality of channel structures intersects the plurality of gate electrodes;

a block isolation region extending in a second direction intersecting the first direction, wherein the block isolation region cuts the mold structure;

a source layer disposed between the cell substrate and the mold structure, and connected to a side surface of each of the plurality of channel structures; and a support layer disposed between the source layer and the mold structure, and extending along and on the upper surface of the cell substrate and an upper surface of the source layer, wherein the support layer includes a support structure in contact with the upper surface of the cell substrate, and the support structure includes a plurality of first extensions disposed on the first region, arranged side by side, and extending in the second direction.

12. The semiconductor memory device of claim 11, wherein the cell substrate further includes a second region, the cell array region and the second region are arranged along the second direction, and the plurality of gate electrodes are stacked in a stepwise manner along the second direction on the second region.

13. The semiconductor memory device of claim 12, wherein the support structure further includes a plurality of second extensions disposed on the second region, arranged side by side, and extending in the first direction.

14. The semiconductor memory device of claim 11, further comprising:

a source sacrificial layer between the cell substrate and the support layer, wherein the source sacrificial layer is disposed at a level the same as a level at which the source layer is disposed, and the source layer and the source sacrificial layer include different materials.

15. An electronic system comprising:

a main substrate;

a semiconductor memory device disposed on the main substrate; and a controller disposed on the main substrate and electrically connected to the semiconductor memory device, wherein the semiconductor memory device includes:

a cell substrate including a cell array region and an extension region surrounding the cell array region;

a mold structure including a plurality of gate electrodes sequentially stacked on the cell substrate, wherein the plurality of gate electrodes are stacked in a stepwise manner on the extension region;

a plurality of channel structures disposed on the cell array region and extending in a vertical direction intersecting an upper surface of the cell substrate, wherein each of the plurality of channel structures intersects the plurality of gate electrodes;

a source layer disposed between the cell array region of the cell substrate and the mold structure, and connected to a side surface of each of the plurality of channel structures; and a support layer disposed between the source layer and the mold structure, wherein the support layer extends along and on the upper surface of the cell substrate and an upper surface of the source layer, wherein the support layer includes a support structure in contact with the upper surface of the cell substrate, at least a portion of the support structure continuously extends, and surrounds the cell array region, and the support structure is formed in a mesh shape on the extension region in a plan view of the device.

16. The electronic system of claim 15, wherein the semiconductor memory device further includes:

a plurality of bit-lines, wherein each of the plurality of bit-lines extends in a first direction intersecting the vertical direction, and is connected to at least some of the plurality of channel structures; and a plurality of block isolation regions, wherein each of the plurality of block isolation regions extend in a second direction intersecting the vertical direction and the first direction, and cuts the mold structure.

* * * * *